(12) United States Patent
Abe et al.

(10) Patent No.: US 8,705,242 B2
(45) Date of Patent: Apr. 22, 2014

(54) INVERTER DEVICE AND DRIVE UNIT USING THE SAME

(75) Inventors: Tatsuya Abe, Chiryu (JP); Masashi Yamasaki, Obu (JP)

(73) Assignee: Denso Corporation, Kariya (JP)

( * ) Notice: Subject to any disclaimer, the term of this patent is extended or adjusted under 35 U.S.C. 154(b) by 183 days.

(21) Appl. No.: 13/066,864

(22) Filed: Apr. 27, 2011

(65) Prior Publication Data

US 2011/0286185 A1    Nov. 24, 2011

(30) Foreign Application Priority Data

May 21, 2010   (JP) ................................. 2010-117682

(51) Int. Cl.
  *H05K 7/00*   (2006.01)
(52) U.S. Cl.
  USPC .......................................... 361/728; 361/722
(58) Field of Classification Search
  USPC .......................................... 361/722, 728–730
  See application file for complete search history.

(56) References Cited

U.S. PATENT DOCUMENTS

| | | | |
|---|---|---|---|
| 6,046,921 A * | 4/2000 | Tracewell et al. ............ | 363/141 |
| 7,508,668 B2 | 3/2009 | Harada et al. | |
| 7,633,758 B2 | 12/2009 | Oohama | |
| 7,724,523 B2 | 5/2010 | Ishiyama | |
| 7,826,226 B2 | 11/2010 | Ishiyama | |
| 7,961,472 B2 * | 6/2011 | Tokuyama et al. ........... | 361/718 |
| 8,027,161 B2 | 9/2011 | Ishiyama | |
| 2007/0035186 A1 | 2/2007 | Asao et al. | |
| 2007/0076355 A1 * | 4/2007 | Oohama ........................ | 361/676 |
| 2007/0240662 A1 * | 10/2007 | Kitamura et al. .......... | 123/179.4 |
| 2008/0290506 A1 | 11/2008 | Aoki et al. | |
| 2010/0208427 A1 * | 8/2010 | Horiuchi et al. .............. | 361/699 |

FOREIGN PATENT DOCUMENTS

| | | |
|---|---|---|
| CN | 1913297 A | 2/2007 |
| JP | 2002-325467 | 11/2002 |
| JP | 2004-237832 | 8/2004 |
| JP | 2008-29093 | 8/2008 |

OTHER PUBLICATIONS

Office Action mailed May 8, 2012 in corresponding Japanese Application No. 2010-117682 (with English translation).
Office Action issued Nov. 5, 2013 in corresponding CN Application No. 201110139059.5 (with English translation).
Office Action mailed May 15, 2013 in corresponding Chinese Application No. 201110139059.5 (with English translation).

* cited by examiner

*Primary Examiner* — Bernard Rojas
(74) *Attorney, Agent, or Firm* — Harness, Dickey & Pierce, PLC

(57) ABSTRACT

In two systems of three-phase alternating-current inverter devices that drive a motor, power elements on power supply sides of bridge circuits are mounted on unit bases to constitute upper arm units. Power elements on ground sides of the bridge circuits are mounted on unit bases to constitute lower arm units. The upper arm units and the lower arm units are arranged separately on upper surfaces and outside surfaces of heat dissipation blocks of a heat sink. Heats generated by the power elements do not interfere with each other and are emitted to the heat sink, whereby heat dissipation performance of the power elements constituting the bridge circuits is improved.

20 Claims, 19 Drawing Sheets

FIG. 25  COMPARATIVE EXAMPLE
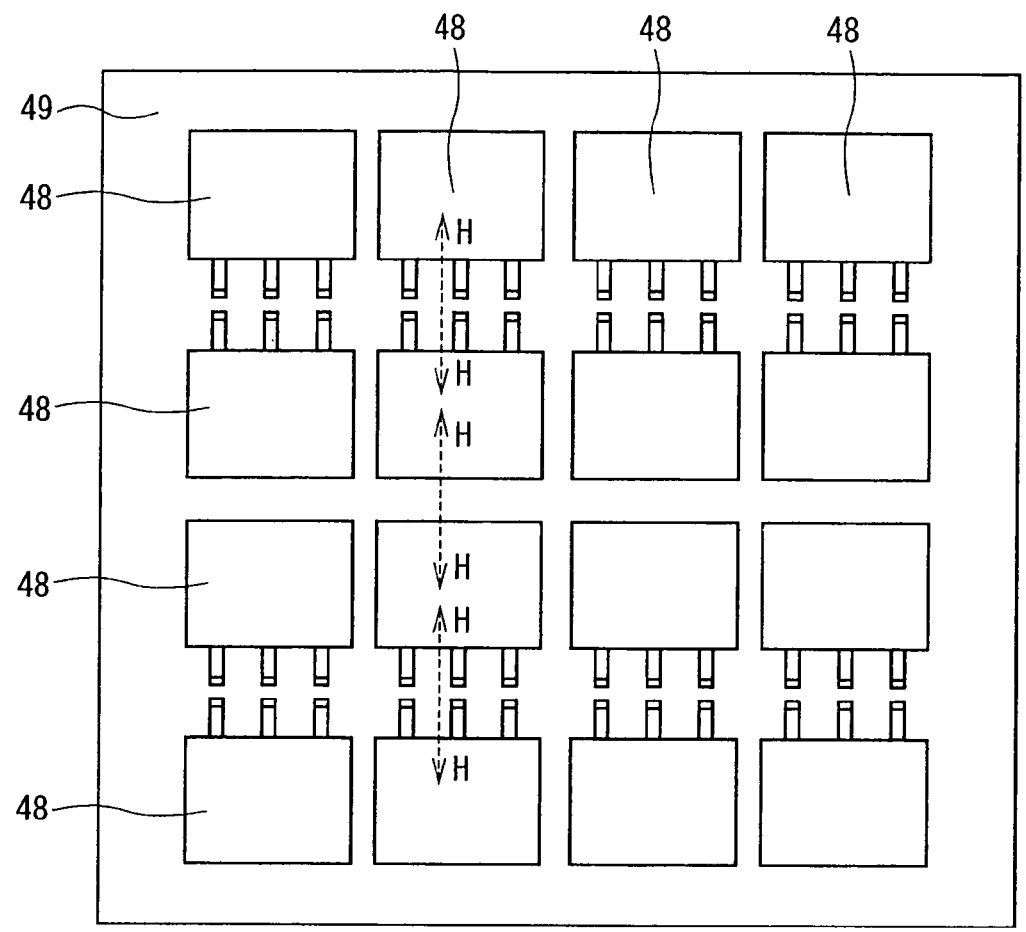

INVERTER DEVICE AND DRIVE UNIT USING THE SAME

CROSS REFERENCE TO RELATED APPLICATION

This application is based on and incorporates herein by reference Japanese Patent Application No. 2010-117682 filed on May 21, 2010.

BACKGROUND OF THE INVENTION

1. Field of the Invention:

The present invention relates to an inverter device that produces multiple-phase alternating-current power from direct-current power and to a drive unit using the inverter device.

2. Description of Related Art:

Conventionally, an electric power steering system for assisting steering, which is performed by a driver, has been publicly known. An inverter device that produces alternating-current power from direct-current power is used as a controller for controlling drive of a motor in the electric power steering system. The inverter device is constructed by mounting electronic components such as semiconductor power devices such as transistors, resistors and capacitors on a power substrate. For example, a control unit and an electric power converter that are applied to an electric power steering controller and that correspond to an inverter device are described in Patent document 1 (JP-A-2004-237832) and Patent document 2 (JP-A-2008-029093).

In the control unit for the electric power steering described in Patent document 1, a power substrate (drive substrate) and a control board are arranged to be perpendicular to each other. However, the power substrate is formed in a single planar shape, on which multiple power elements (semiconductor switching elements) are mounted. Therefore, heats generated by adjacent power elements interfere with each other, thereby hindering heat dissipation. Therefore, there is a possibility that a failure or malfunction due to temperature increase of the power elements is caused.

In the electric power converter described in Patent document 2, one unit (power switching device group) is constituted for each set of bridge circuit. For example, a bridge circuit for producing three-phase alternating current has three units. When two systems of circuits for producing the three-phase alternating current are used, six units are used, thereby increasing the number of units.

SUMMARY OF THE INVENTION

It is an object of the present invention to provide an inverter device improving heat dissipation performance of multiple power elements constituting a bridge circuit and to provide a drive unit using the inverter device. According to a first example aspect of the present invention, an inverter device produces alternating-current power of multiple phases from direct-current power. The inverter device has multiple power elements, a heat sink, a control wiring section and a power wiring section.

The multiple power elements constitute a bridge circuit. The heat sink is mounted with the power elements and is capable of receiving a heat generated by the power elements. The control wiring section outputs control signals to the power elements. The power wiring section inputs and outputs current passed to the power elements.

Each of the power elements has a main body section, in which a semiconductor chip is inserted in a resin by resin molding, and a lead section that extends from one side of the main body section and that is electrically connected with the power wiring section. An upper arm unit, which is formed by aggregating the power elements on a power supply side of the bridge circuit, and a lower arm unit, which is formed by aggregating the power elements on a ground side of the bridge circuit, are arranged separately from each other.

The multiple power elements are mounted on the heat sink, and the upper and lower arm units are arranged separately from each other. Therefore, heats generated by the power elements do not interfere with each other but are emitted to the heat sink. Accordingly, heat dissipation performance of the power elements can be improved. As a result, failure and malfunction due to temperature increase of the power elements can be prevented.

The power elements may include switching power elements constituting the bridge circuit. The power elements may include power supply relay power elements connected between a power supply line and the bridge circuit for blocking current supply to the bridge circuit and for protecting the circuit. According to the present invention, at least the switching power elements constituting the upper and lower arms of the bridge circuit are arranged to be divided into the upper arm unit and the lower arm unit.

In the conventional inverter device of Patent document 2 producing the three-phase alternating current, the six switching power elements constitute three sets of units, each of which consists of the two switching power elements, for the phases respectively. As contrasted thereto, the six switching power elements are divided into the upper arm unit and the lower arm unit to constitute two sets of units, each of which consists of the three switching power elements. Thus, the number of units can be reduced. Moreover, when the inverter device has the two systems of three-phase inverter circuits, the number of units can be reduced from six to four as compared to the conventional technology.

When two more power elements for the power supply relay are used for each system of the three-phase inverter circuit, one power supply relay power element may be included in the upper arm unit, and the other power supply relay power element may be included in the lower arm unit. Thus, each of the upper arm unit and the lower arm unit can be constituted by the four power elements respectively.

According to a second example aspect of the present invention, the upper arm unit and the lower arm unit are arranged such that the lead sections face to the power wiring section. Accordingly, the lead sections of the power elements of the upper arm unit and the lead sections of the power elements of the lower arm unit face in directions to approach each other. Thus, wiring distances between the power elements of the upper and lower arms can be shortened. Wiring distances between the power elements and the power supply, the ground, produced voltage and the like can be shortened. Accordingly, wiring impedance can be reduced. Accordingly, loss in electric power of the inverter device can be reduced.

According to a third example aspect of the present invention, the upper arm unit and the lower arm unit are mounted on different surfaces of the heat sink. Thus, as compared to the case where the upper arm unit and the lower arm unit are arranged laterally to each other on the same plane, spaces occupied by the upper and lower arm units can be aggregated sterically, and a projective area can be reduced. A resulting vacant space can be effectively used to arrange electronic components such as a choke coil and an electrolytic capacitor therein. Thus, the inverter device can be reduced in size.

According to a fourth example aspect of the present invention, the upper arm unit and the lower arm unit are mounted on the surfaces of the heat sink adjacent to each other. Thus, the upper and lower arm units can be brought specifically close to each other. Accordingly, the wiring distance between the upper and lower arms can be shortened, and the wiring impedance can be reduced. Accordingly, the loss in the electric power of the inverter device can be reduced, and the inverter device can be reduced in size.

According to a fifth example aspect of the present invention, the upper arm unit and the lower arm unit are mounted on the surfaces of the heat sink perpendicular to each other. According to a sixth example aspect of the present invention, the power wiring section is constituted by a power substrate in the shape of a flat plate. One of the upper arm unit and the lower arm unit is mounted on the surface parallel to the power substrate. The other one of the upper arm unit and the lower arm unit is mounted on the surface perpendicular to the power substrate.

For example, if an outline of the heat sink is formed substantially in the shape of a cuboid, the upper surface and the side surface of the substantially cuboid-like shape are adjacent and perpendicular to each other. The upper surface is parallel to the power substrate and the side surface is perpendicular to the power substrate. The upper arm unit is mounted on the upper surface, and the lower arm unit is mounted on the side surface. In this way, by forming the outline of the heat sink substantially in the shape of the cuboid, design and processing of the inverter device are facilitated.

According to a seventh example aspect of the present invention, each of the upper arm unit and the lower arm unit is formed by mounting the power elements on a unit base in the shape of a flat plate. The upper and lower arm units are provided as subassemblies respectively. Thus, the assembly process of the inverter device can be simplified.

According to an eighth example aspect of the present invention, the unit base has a heat dissipation layer that is made of a thermally-conductive material and that contacts the heat sink. Thus, the heat dissipation performance of the power elements further improves.

According to a ninth example aspect of the present invention, the unit base has an insulation layer for insulating the power elements from each other. Generally, a drain electrode of a commercial general-purpose power element is exposed on a surface, which is to be mounted on a substrate. Regarding this point, according to the above-described aspect of the present invention, the unit base has the insulation layer, and the drain electrode contacts the insulation layer. Thus, even in the case where the general-purpose power elements are used, short-circuit among the power elements can be prevented.

According to a tenth example aspect of the present invention, each of the upper arm unit and the lower arm unit is formed as a power module, in which the power elements are integrated by resin molding. Thus, the number of parts can be reduced, and the assembly process of the inverter device can be simplified.

According to an eleventh example aspect of the present invention, a drive unit has a stator, around which windings are wound to form multiple phases, a rotor arranged radially inside the stator to be rotatable relative to the stator, and the above-described inverter device provided on one axial side of the rotor.

The inverter device according to the present invention can improve the heat dissipation performance of the power elements. Therefore, for example, it is specifically effective to apply the inverter device according to the present invention to a high-power motor drive unit for an electric power steering system.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

FIG. 25 is a schematic diagram showing an inverter device of a comparative example.

DETAILED DESCRIPTION OF EXAMPLE EMBODIMENT

Figure 1:
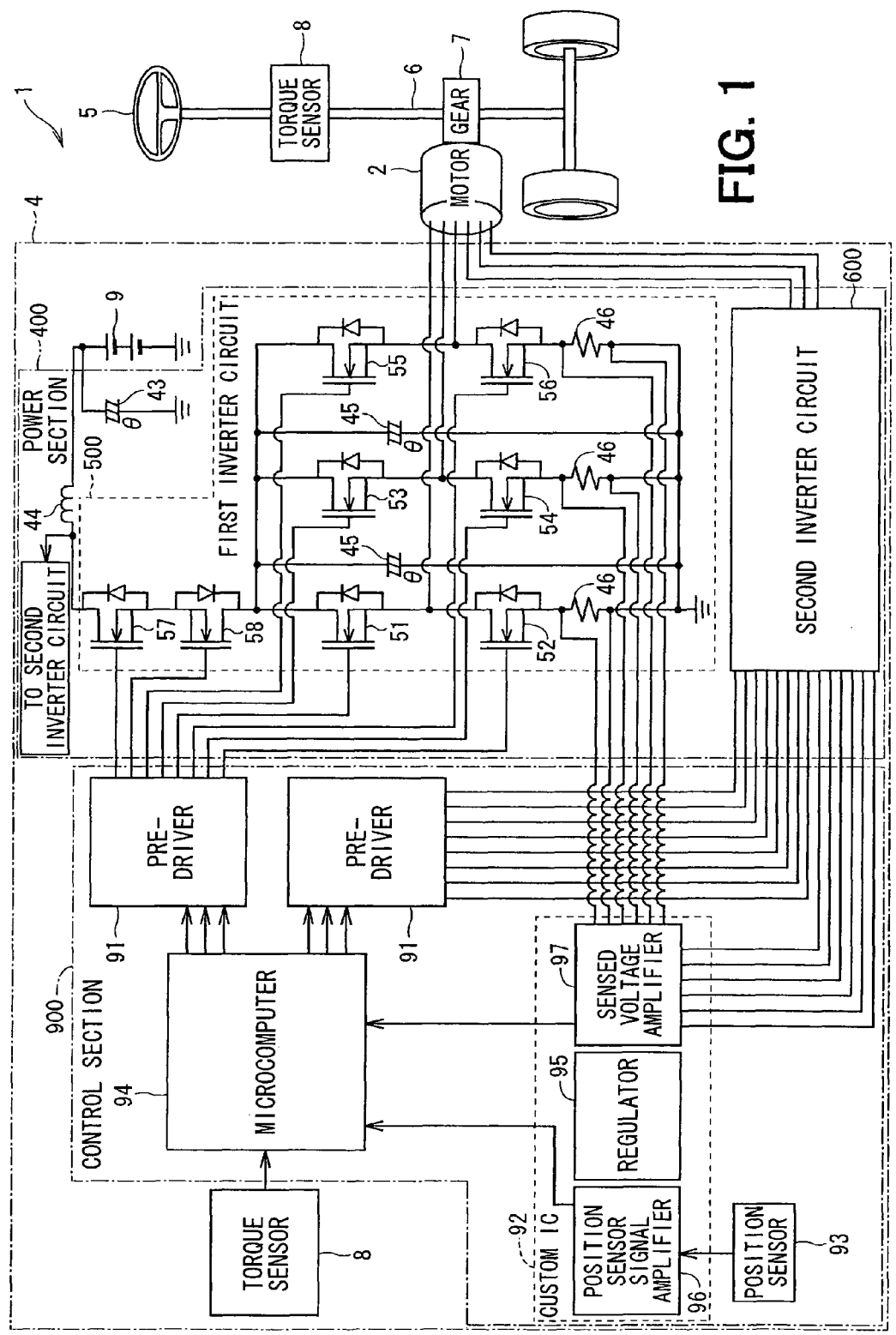
FIG. 1 is a schematic construction diagram showing an electric power steering system according to a first embodiment of the present invention.
Figure 2:
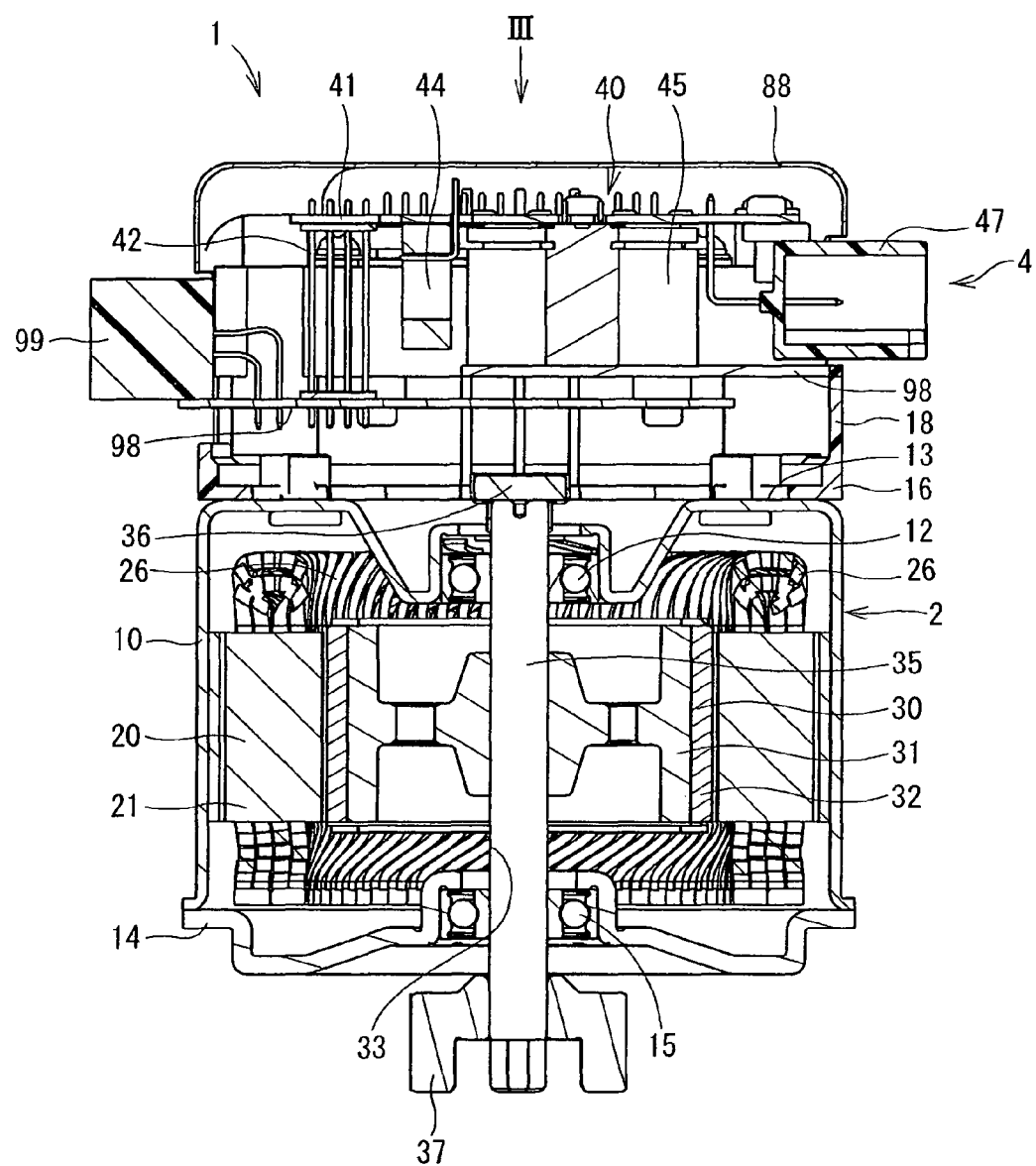
FIG. 2 is a cross-sectional view showing a drive unit according to the first embodiment.
Figure 3:
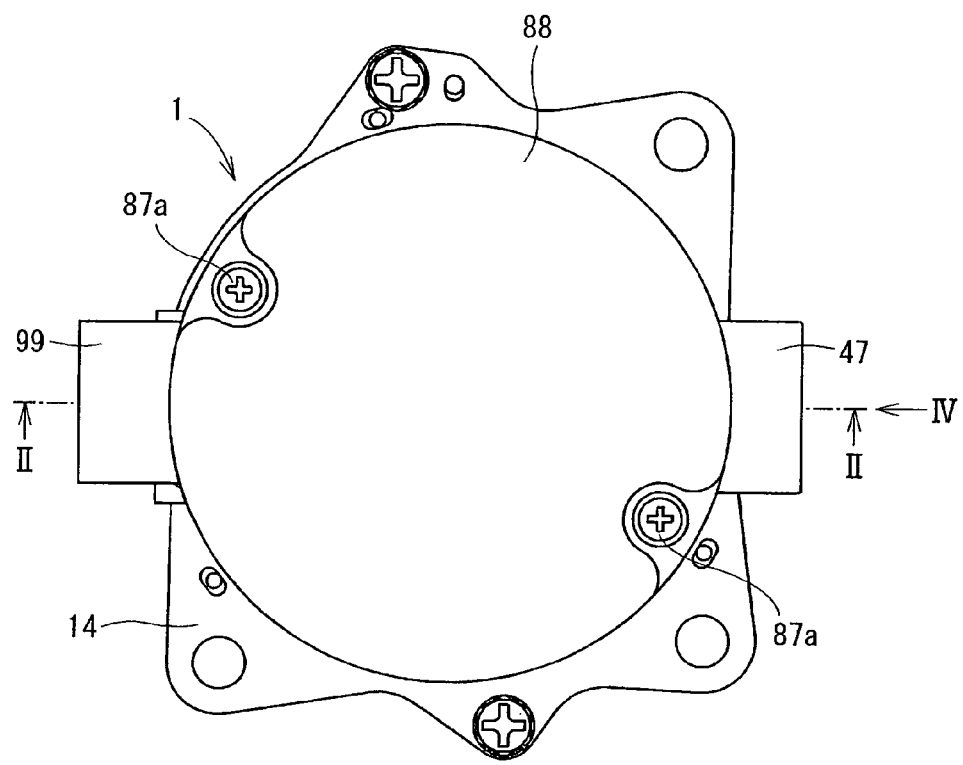
FIG. 3 is a plan view showing the drive unit according to the first embodiment.
Figure 4:
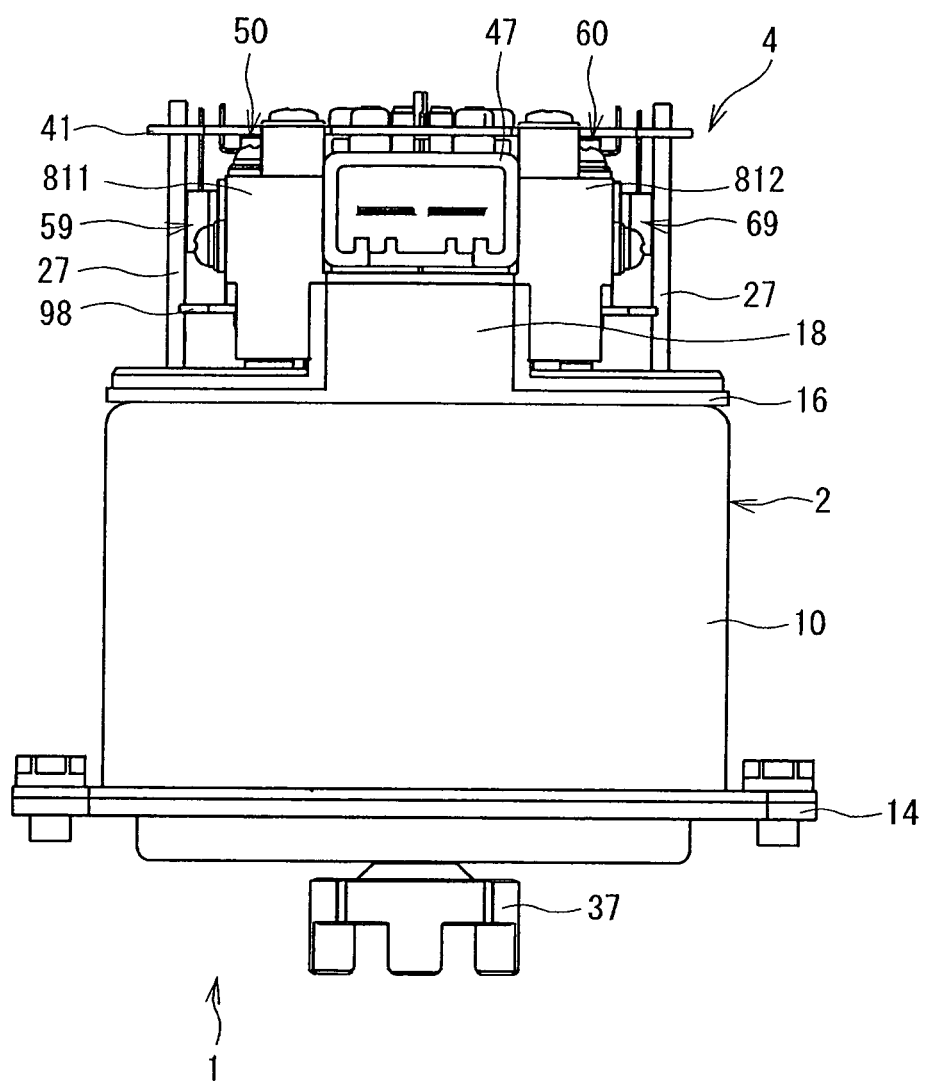
FIG. 4 is a view showing the uncovered drive unit of FIG. 3 along a direction of an arrow mark IV.
Figure 5:
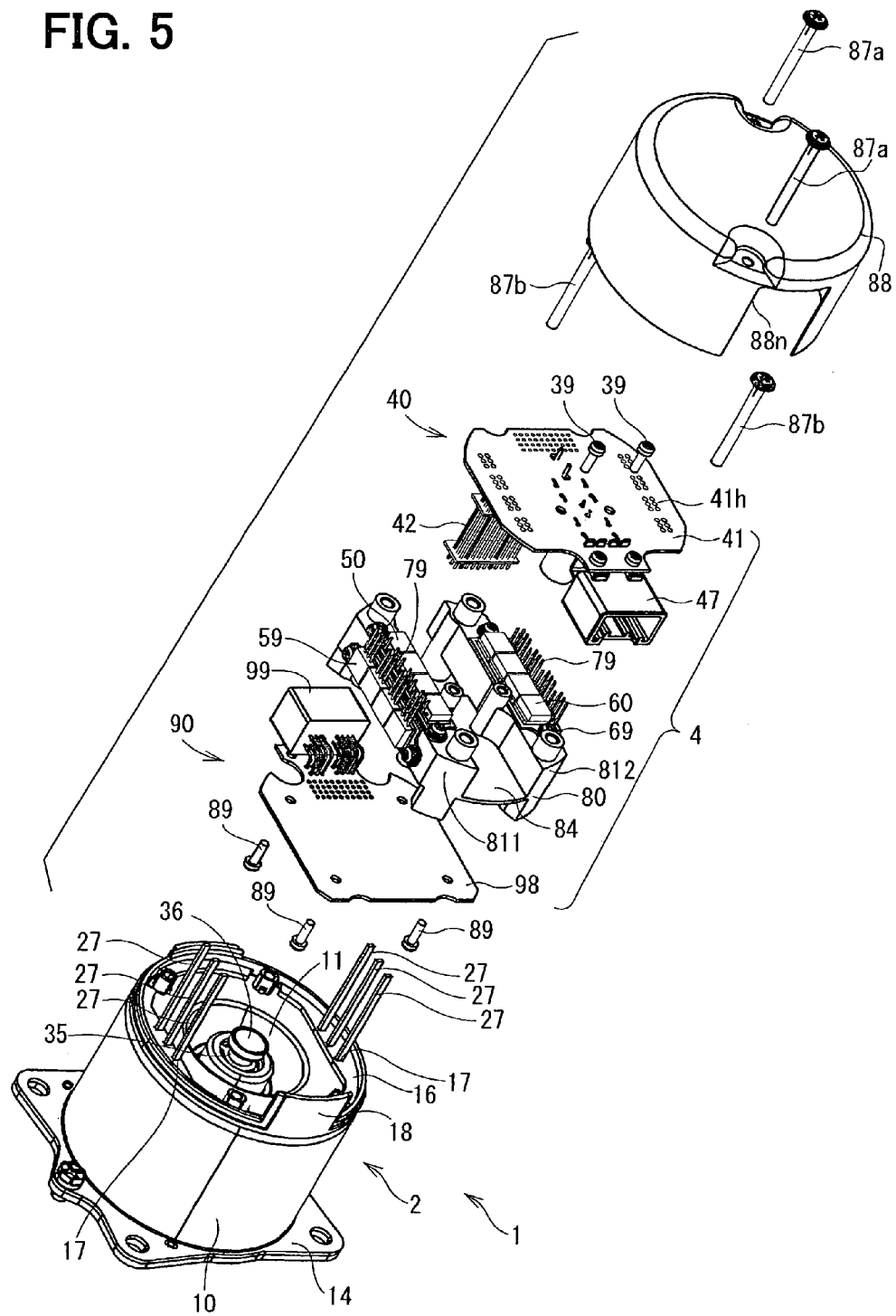
FIG. 5 is an exploded perspective view showing the drive unit according to the first embodiment.
Figure 6:
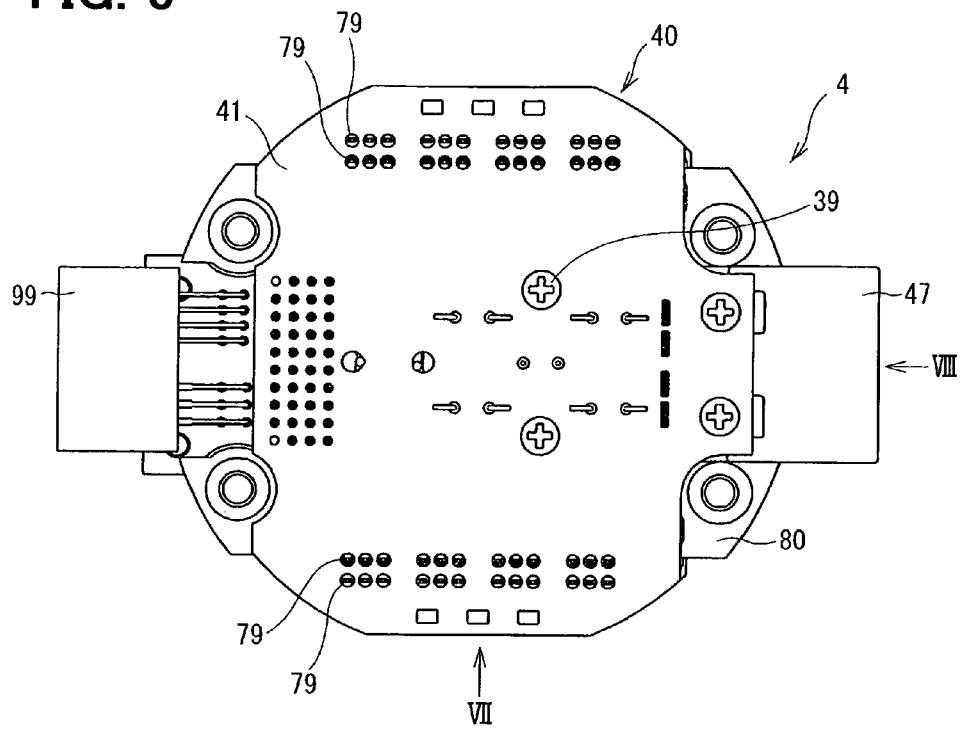
FIG. 6 is a plan view showing an inverter device according to the first embodiment.
Figure 7:
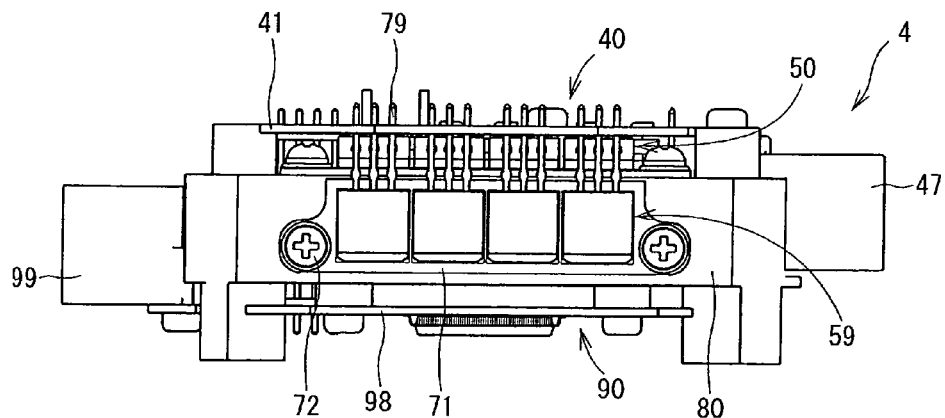
FIG. 7 is a view showing the inverter device of FIG. 6 along a direction of an arrow mark VII.
Figure 8:
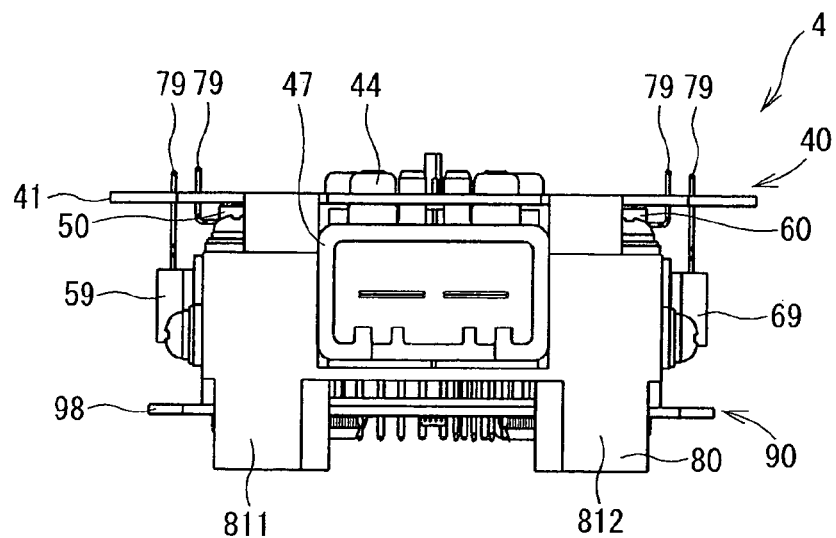
FIG. 8 is a view showing the inverter device of FIG. 6 along a direction of an arrow mark VIII.
Figure 9:
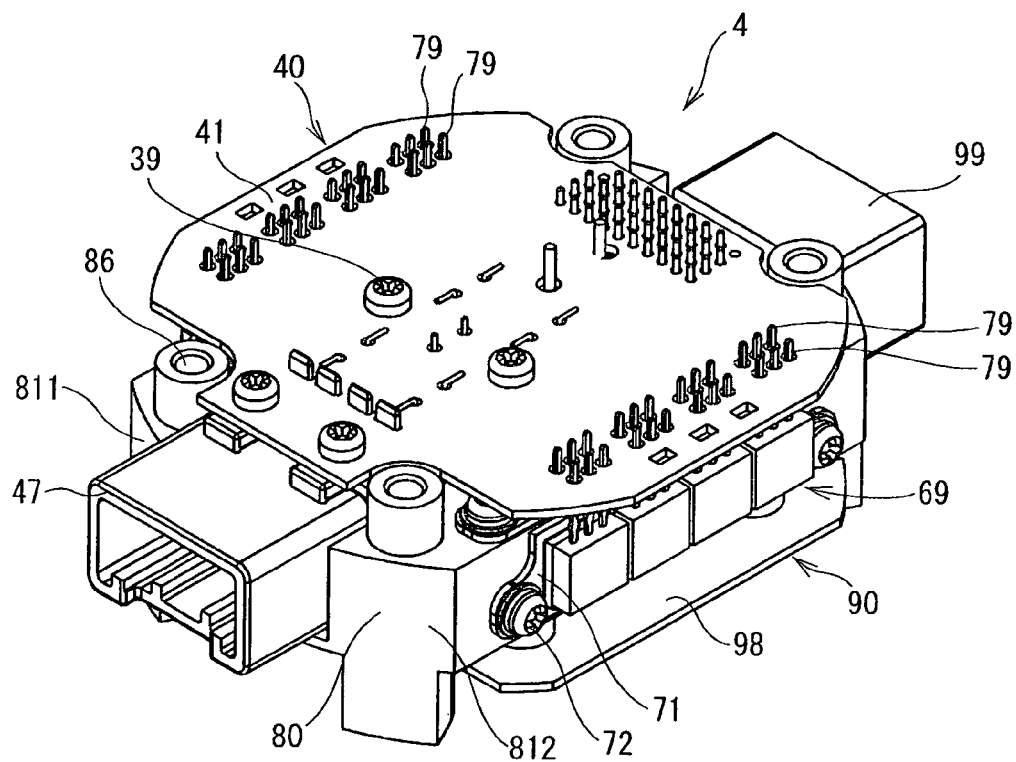
FIG. 9 is a perspective view showing the inverter device according to the first embodiment.
Figure 10:
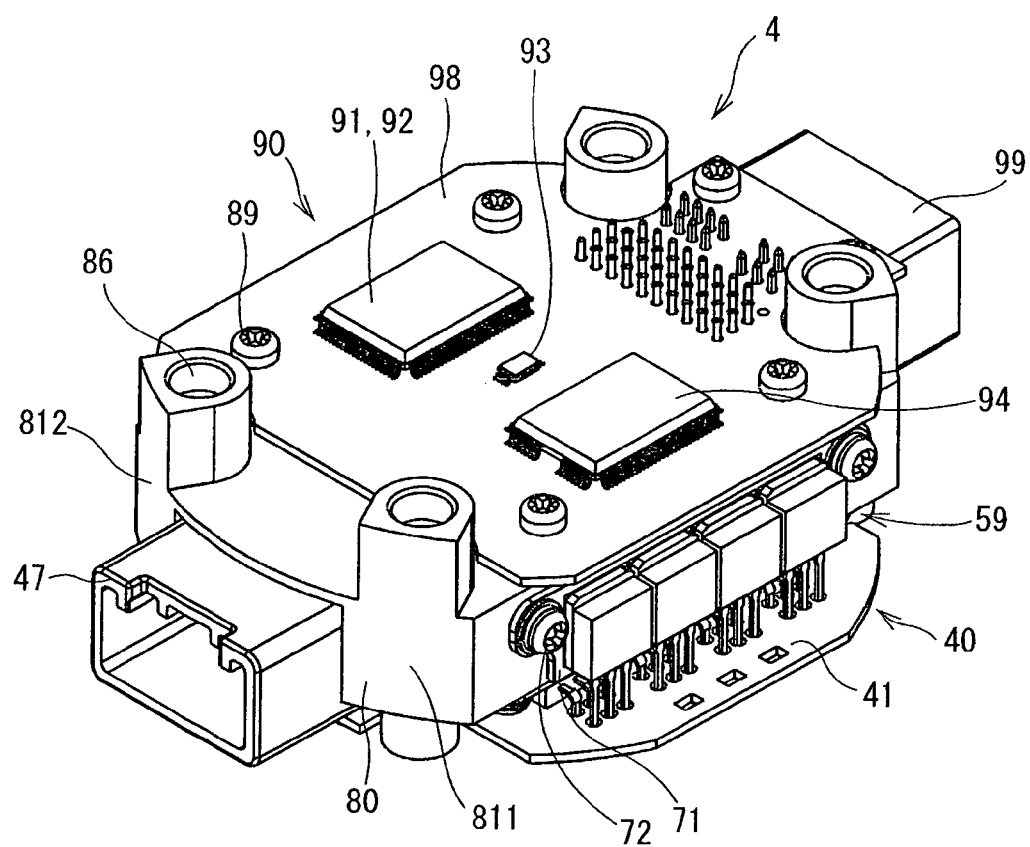
FIG. 10 is a perspective bottom view showing the inverter device according to the first embodiment.
Figure 11:
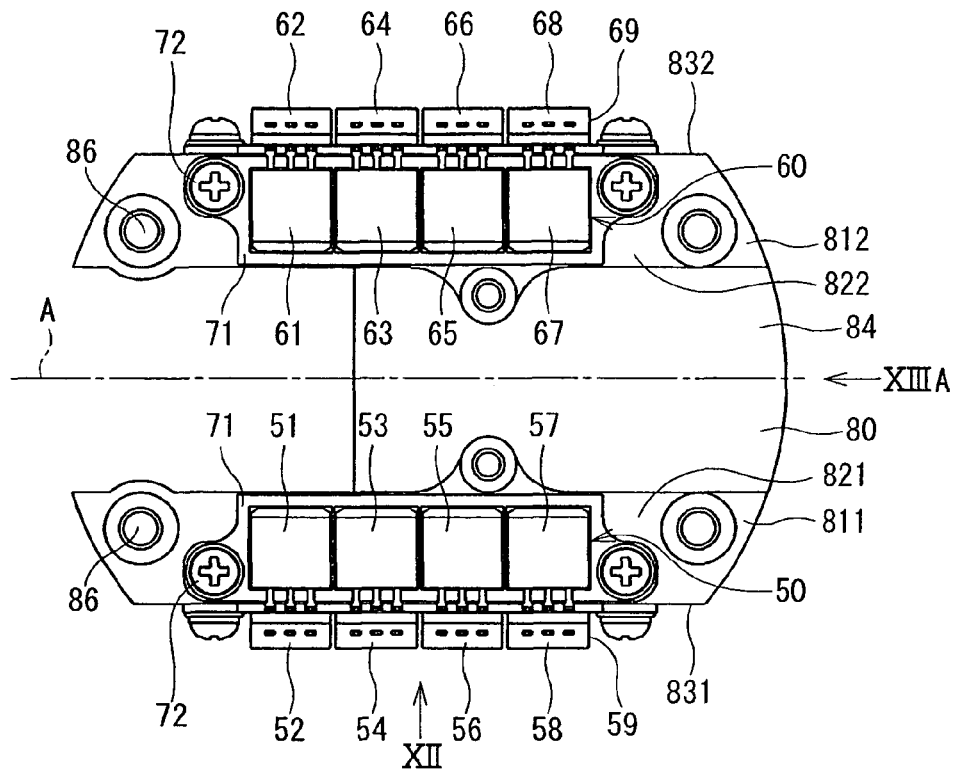
FIG. 11 is a plan view showing the inverter device with upper and lower arm units mounted on a heat sink according to the first embodiment.
Figure 12:
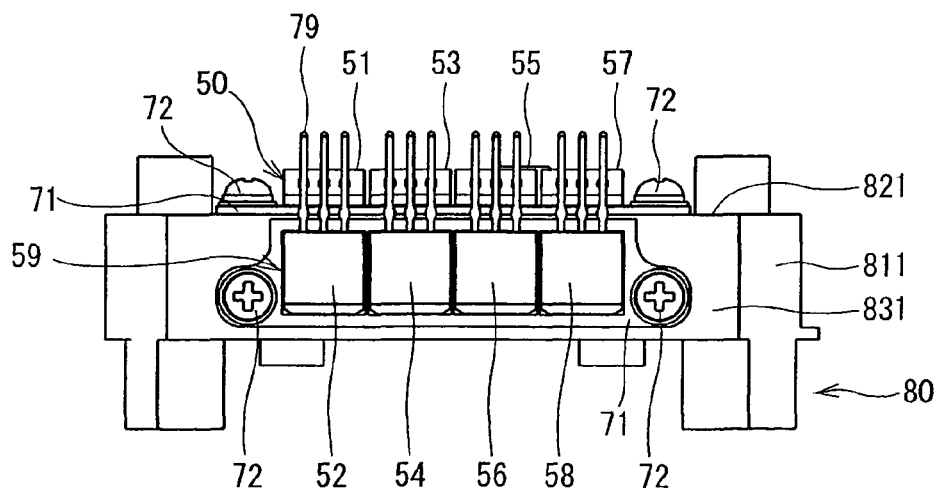
FIG. 12 is a view showing the inverter device of FIG. 11 along a direction of an arrow mark XII.
Figure 13A:
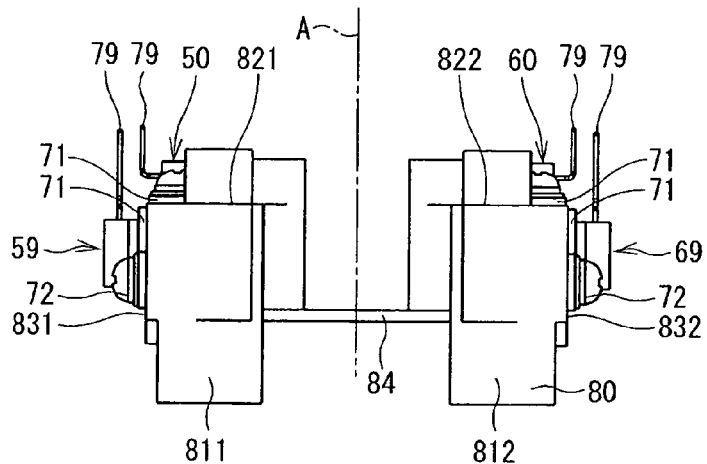
FIG. 13A is a view showing the inverter device of FIG. 11 along a direction of an arrow mark XIIIA.
Figure 13B:
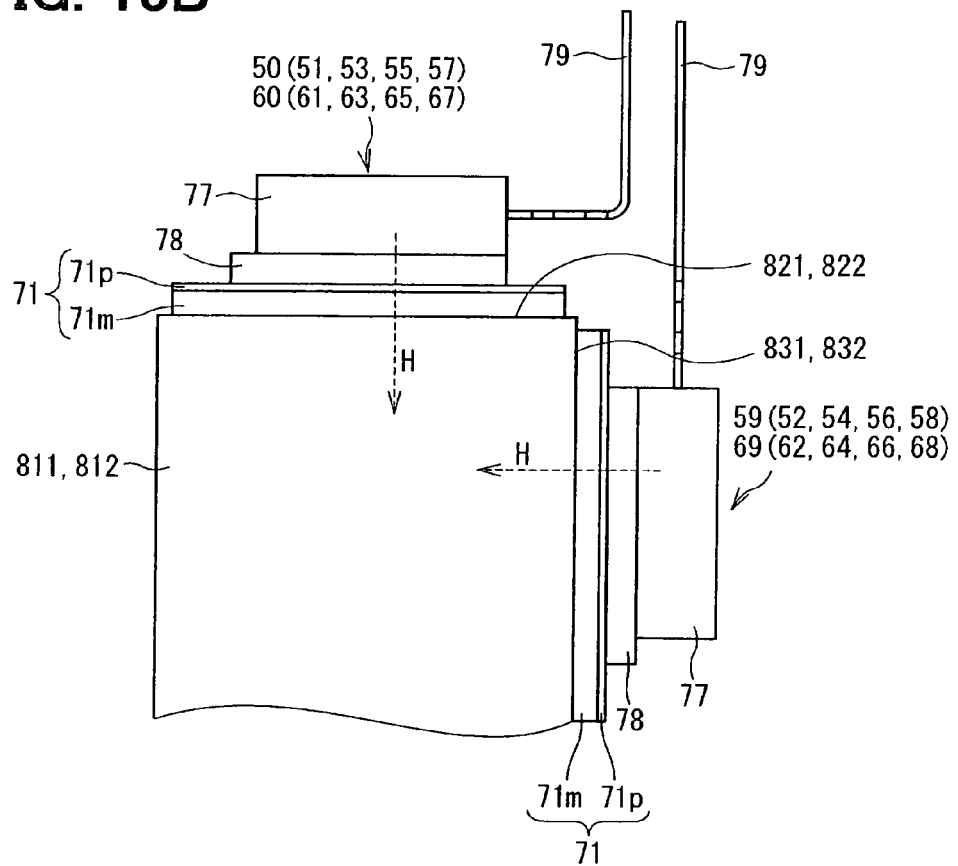
FIG. 13B is a schematic view showing a substantial part of the inverter device of FIG. 13A.
Figure 14:
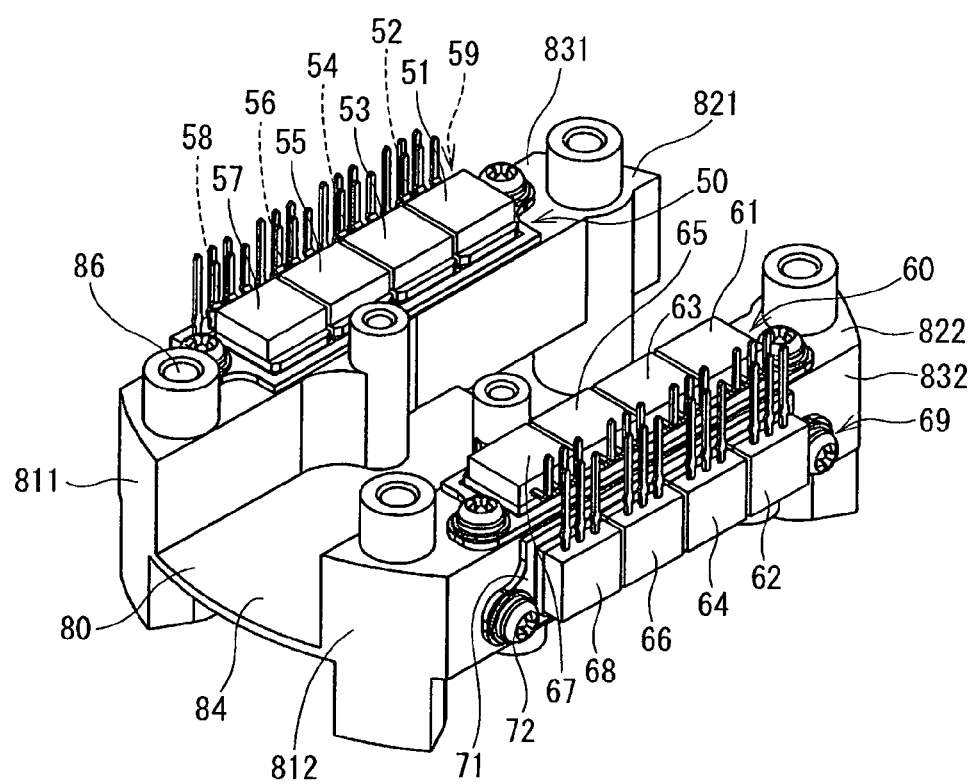
FIG. 14 is a perspective view showing the inverter device with the upper and lower arm units mounted on the heat sink according to the first embodiment.

Hereafter, an inverter device and a drive unit according to each of embodiments of the present invention will be described with reference to the drawings. The same sign is used for substantially the same construction among the embodiments.

(First Embodiment)

An inverter device according to a first embodiment of the present invention and a drive unit using the same are shown in FIGS. 1 to 18. The drive unit 1 according to the present embodiment is applied to an electric power steering system. The drive unit 1 has a motor 2 and the inverter device 4. The inverter device 4 consists of a control board assembly 90, a heat sink 80, multiple power elements mounted on the heat sink 80, a power substrate assembly 40 and the like. The control board assembly 90 corresponds to the control wiring section according to the present invention. The power substrate assembly 40 corresponds to the power wiring section according to the present invention.

First, an electric construction of the electric power steering system will be explained with reference to FIG. 1. The electric construction explained below is commonly used also in the subsequent embodiments. As shown in FIG. 1, the drive unit 1 generates rotation torque in a column shaft 6 via a gear 7 attached to the column shaft 6. The column shaft 6 is a rotary shaft of a steering 5 of a vehicle. Thus, the drive unit 1 assist steering of the steering 5. More specifically, if a driver manipulates the steering 5, the drive unit 1 senses steering torque, which is caused in the column shaft 6 by the manipulation, with the use of a torque sensor 8. The drive unit 1 obtains vehicle speed information from CAN (Controller Area Network), which is not shown in FIG. 1, and assists the steering of the steering 5, which is performed by the driver. The use of such the construction is not limited to the assist of the steering. Rather, such the construction can be applied to automatic control of the operation of the steering 5 such as maintenance of a vehicle position in a traffic lane on a highway and guidance to a parking space in a parking lot by using appropriate control methods.

A motor 2 is a brushless motor for causing the gear 7 to perform normal rotation and reverse rotation. The inverter device 4 controls current supply and drive of the motor 2. The inverter device 4 consists of a power section 400, to which drive current for the motor 2 is passed, and a control section 900 for controlling drive of the power section 400.

The power section 400 has a choke coil 44, an electrolytic capacitor 43 and two systems of inverter circuits 500, 600 between a battery 9 and a power supply line. A construction of the inverter circuit 500 of the first system is the same as a construction of the inverter circuit 600 of the second system. Therefore, the inverter circuit 500 of the first system will be explained below as a representative example. The inverter device 4 has the two systems of the inverter circuits. Therefore, even if one system breaks down, the drive unit 1 can continue the drive by the other system.

The inverter circuit 500 has eight power elements 51-58. The six power elements 51-56 are power elements for switching and constitute a three-phase bridge circuit. The two power elements 57, 58 are power elements for a power supply relay. The power elements 57, 58 are provided between the battery 9 and the power supply line on a power supply side of the bridge circuit. Parasitic diodes of the power elements 57, 58 are set opposite to each other. If an abnormality occurs in the drive unit 1, the power elements 57, 58 are switched off by commands from the control section 900. Thus, the power elements 57, 58 block the current flowing toward the motor 2 via the bridge circuit and the like.

The power elements 51-58 are MOS field-effect transistors, for example. Specifically in the present embodiment, it is assumed that commercial general-purpose MOS is used as each of the power elements 51-58. The power elements 61-68 of the inverter circuit 600 of the second system (refer FIG. 11, for example) are equivalent to the power elements 51-58.

In each of the power elements 51-56 for the switching, conduction between a source and a drain is switched on (i.e., made) or switched off (i.e., blocked) by a gate potential. The drains of the power elements 51, 53, 55 are connected to the power supply line. The sources of the power elements 51, 53, 55 are connected with the drains of the power elements 52, 54, 56 respectively. The sources of the power elements 52, 54, 56 are connected to the ground. Connection points between the power elements 51, 53, 55 and the power elements 52, 54, 56 are connected to a U-phase coil, a V-phase coil and a W-phase coil of the motor 2 respectively.

Shunt resistances 46 are electrically connected between the ground-side power elements 52, 54, 56 and the ground. Voltages or currents applied to the shunt resistances 46 are sensed to sense currents passed to the U-phase coil, the V-phase coil and the W-phase coil.

The choke coil 44 and the electrolytic capacitor 43 are electrically connected between the battery 9 and the power supply relay. The choke coil 44 and the electrolytic capacitor 43 constitute a filter circuit and reduce noises transmitted from other devices sharing the battery 9. The choke coil 44 and the electrolytic capacitor 43 reduce noises transmitted from the drive unit 1 to the other devices sharing the battery 9.

Two electrolytic capacitors 45 are provided for each system between the power supply line and the ground line in parallel with the power elements 51, 53, 55 on the power supply side, the power elements 52, 54, 56 on the ground side and the shunt resistances 46. The electrolytic capacitors 45 store electric charges for assisting the power supply to the power elements 51-56 and for inhibiting noise components such as surge voltage.

The control section 900 has pre-drivers 91, a custom IC 92, a position sensor 93 and a microcomputer 94. The custom IC 92 has a regulator section 95, a position sensor signal amplifier 96 and a sensed voltage amplifier 97 as functional blocks.

The regulator section 95 is a stabilization circuit for stabilizing the power supply. The regulator section 95 stabilizes the power supply supplied to respective parts. For example, the microcomputer 94 operates at a predetermined voltage (for example, 5V) stabilized by the regulator section 95.

A signal from the position sensor 93 is inputted to the position sensor signal amplifier 96. The position sensor 93 senses a rotational position signal of the motor 2. The sensed rotational position signal is transmitted to the position sensor signal amplifier 96. The position sensor signal amplifier 96 amplifies the rotational position signal and outputs the amplified signal to the microcomputer 94. The sensed voltage amplifier 97 senses and amplifies voltages between both ends of the shunt resistances 46 (referred to as both-end voltages, hereafter). The sensed voltage amplifier 97 outputs the amplified voltages to the microcomputer 94.

The rotational position signal of the motor 2 and the both-end voltages of the shunt resistances 46 are inputted to the microcomputer 94. A steering torque signal is inputted to the microcomputer 94 from the torque sensor 8 attached to the column shaft 6. The vehicle speed information is inputted to the microcomputer 94 via the CAN. If the steering torque signal and the vehicle speed information are inputted to the microcomputer 94, the microcomputer 94 controls the inverter circuit 500 via the pre-driver 91 according to the rotational position signal in order to assist the steering of the steering 5 according to the vehicle speed. More specifically, the microcomputer 94 controls the inverter circuit 500 by switching the on-states and the off-states of the power elements 51-56 via the pre-driver 91. The gates of the power elements 51-56 are connected to six output terminals of the pre-driver 91. The microcomputer 94 switches the on-states and the off-states of the power elements 51-56 by changing the gate potentials by the pre-driver 91.

The microcomputer 94 controls the inverter circuit 500 to bring the current, which is supplied to the motor 2, close to a sine wave based on the both-end voltages of the shunt resistances 46 inputted from the sensed voltage amplifier 97.

Figure 15A:
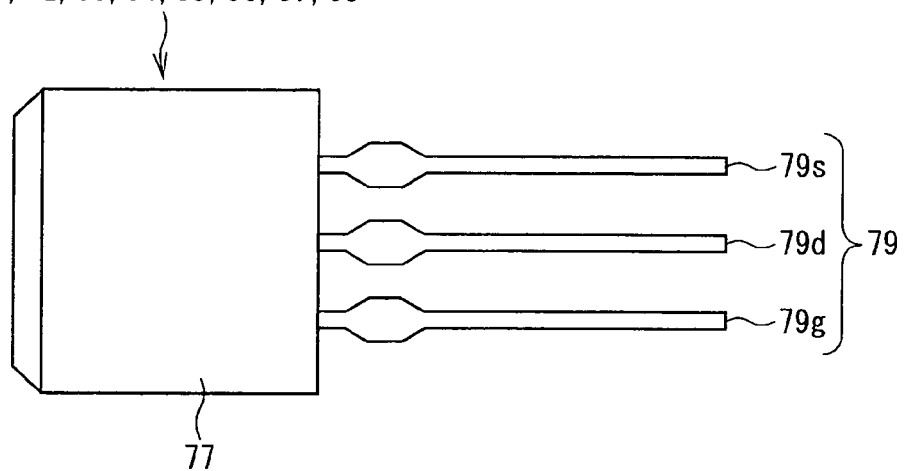
FIG. 15A is a plan view showing a power element used in the inverter device according to the first embodiment or an inverter device according to a second embodiment of the present invention.
Figure 15B:
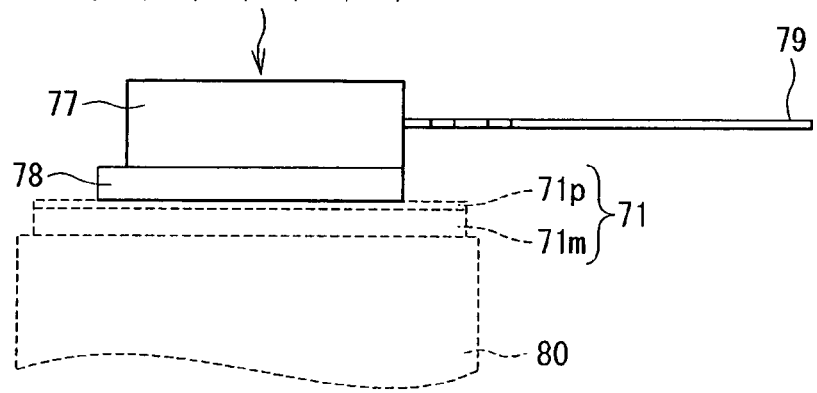
FIG. 15B is a side view showing the power element used in the inverter device according to the first or second embodiment.
Figure 16:
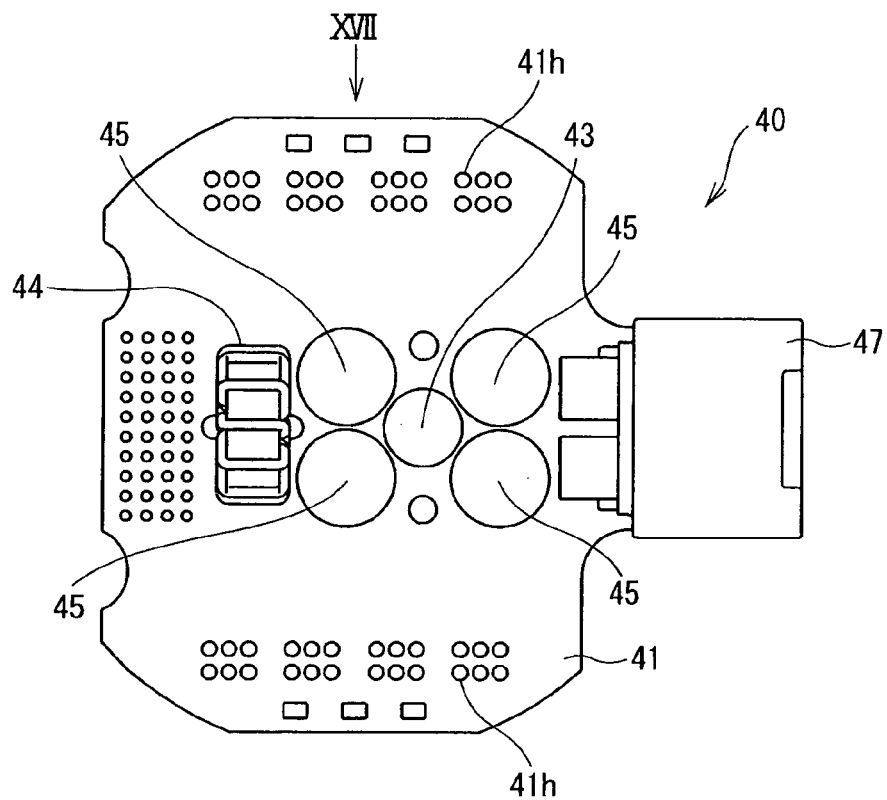
FIG. 16 is a bottom view showing a power substrate assembly of the inverter device according to the first embodiment.
Figure 17:
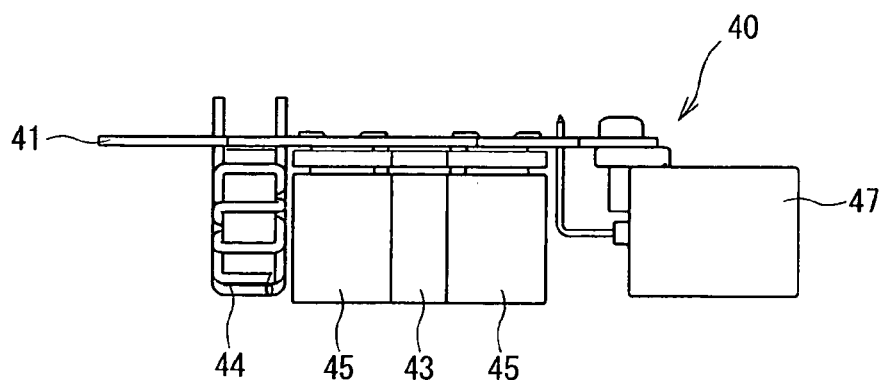
FIG. 17 is a view showing the power substrate assembly of FIG. 16 along a direction of an arrow mark XVII.
Figure 18:
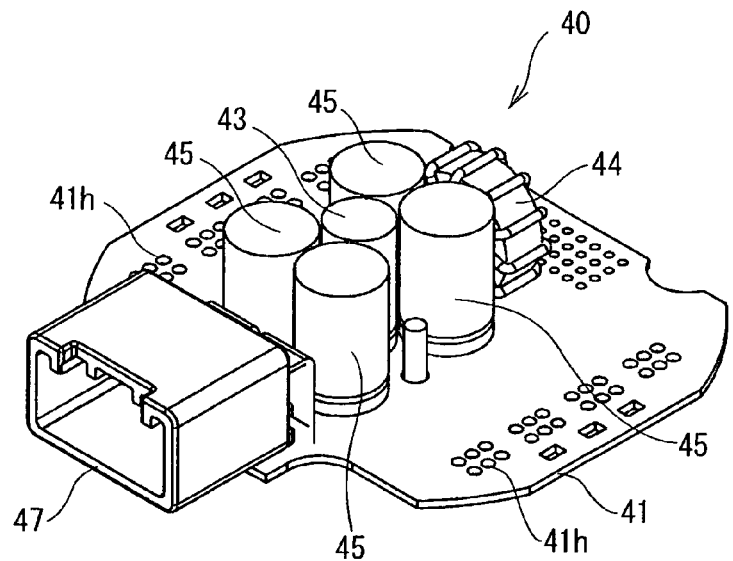
FIG. 18 is a perspective view showing the power substrate assembly according to the first embodiment.

Next, constructions of the inverter device 4 and the drive unit 1 will be explained with reference to FIGS. 2 to 18. FIGS. 2 to 5 are views each showing the entire drive unit 1. FIGS. 6 to 10 are views each showing the inverter device 4. FIGS. 11 to 14 are views each showing the heat sink 80 and the multiple power elements. FIGS. 16 to 18 are views each showing the power substrate assembly 40. The drive unit 1 according to the present embodiment has the inverter device 4 arranged on an axial end surface 13 side of the motor 2, whereby the motor 2 and the inverter device 4 provide a stacked structure.

First, the motor 2 will be explained. The motor 2 has a motor case 10, a stator 20, a rotor 30, a shaft 35 and the like. The motor case 10 is formed in the cylindrical shape from iron or the like. A frame end 14 made of aluminum is fixed to an end portion of the motor case 10 on a side opposite to the inverter device 4 with screws or the like. An opening 11 is formed in an axial center of an end portion of the motor case 10 on an inverter device 4 side. The shaft 35 is inserted through the opening 11. A resin guide 16 is provided to the end portion of the motor case 10 on the inverter device 4 side. The resin guide 16 is formed substantially in an annular shape and has an opening in its central portion. Six holes 17 are formed in the resin guide 16.

The stator 20 is provided radially inside the motor case 10. The stator 20 has twelve salient poles 21 protruding toward a radially inner side of the motor case 10. The salient poles 21 are arranged at predetermined intervals in a circumferential direction of the motor case 10. Windings 26 are wound around an insulator (not shown) to provide three-layer windings of a U-phase, a V-phase and a W-phase.

Motor lines 27 are extracted from six points of the windings 26. The motor lines 27 are inserted through the six holes 17 formed in the resin guide 16. Thus, the motor lines 27 are positioned by the resin guide 16 and are surely insulated from the motor case 10. The motor lines 27 are extended to the inverter device 4 side and are passed through spaces radially outside the heat sink 80. The motor lines 27 are connected to a power substrate 41.

The rotor 30 is provided radially inside the stator 20 to be rotatable relative to the stator 20. The rotor 30 is formed of a magnetic material such as iron in the shape of a cylinder. The rotor 30 has a rotor core 31 and permanent magnets 32 provided radially outside the rotor core 31. North poles and south poles of the permanent magnets 32 are arranged alternately in the circumferential direction.

The shaft 35 is fixed to a shaft hole 33 formed in an axial center of the rotor core 31. The shaft 35 is rotatably supported by a bearing 12, which is provided to the motor case 10, and a bearing 15, which is provided to the frame end 14. Thus, the shaft 35 can rotate together with the rotor 30 relative to the stator 20.

A magnet 36 is provided on an end portion of the shaft 35 on a control board 98 side. The magnet 36 is provided at a position facing the position sensor 93 mounted on the control board 98. An output end 37 is provided on an end portion of the shaft 35 on a side opposite to the control board 98. A gearbox (not shown) having the gear 7 inside is provided on an output end 37 side of the shaft 35. The gear 7 is connected with the output end 37 and is rotated and driven by a driving force of the shaft 35.

Next, the inverter device 4 will be explained. The inverter device 4 is provided on a side of the motor 2 opposite to the gearbox. The inverter device 4 is constructed of the control board assembly 90, the heat sink 80, the multiple power elements and the power substrate assembly 40, which are arranged in this order from the motor 2 side.

In the control board assembly 90, various electronic components constituting the control section 900 shown in FIG. 1 are mounted on the control board 98. The control board 98 is formed of a glass epoxy substrate, for example. The control board 98 is screwed to the heat sink 80 with screws 89 from the motor 2 side.

The pre-drivers 91, the custom IC 92, the position sensor 93 and the microcomputer 94 are mounted on an end surface of the control board 98 on the motor 2 side. The position sensor 93 is provided substantially at the center of the control board 98 and faces the magnet 36 of the shaft 35. The position sensor 93 senses the rotation of the shaft 35 by sensing a change in a magnetic field generated by the magnet 36 rotating together with the shaft 35. A control connector 99 is connected to one short side of the control board 98 on a side opposite to the motor 2. The control connector 99 is provided such that wirings can be connected to the control connector 99 from a radially outer side of the motor 2. Sensor information is inputted to the control connector 99 from various sensors.

The heat sink 80 is made of a thermally-conductive material such as aluminum. As shown in FIGS. 11 to 14, the heat sink 80 has a volume capable of receiving a heat generated by the power elements 51-58, 61-68. The heat sink 80 has two heat dissipation blocks 811, 812 that face each other symmetrically across a symmetrical axis A. The heat dissipation blocks 811, 812 are connected by a connecting section 84.

Upper surfaces 821, 822 of the heat dissipation blocks 811, 812 on a power substrate 41 side are respectively adjacent and perpendicular to outside surfaces 831, 832 of the heat dissipation blocks 811, 812 facing radially outward. The upper surfaces 821, 822 are perpendicular to an axial direction of the motor 2. The outside surfaces 831, 832 are parallel to the axial direction of the motor 2.

Four through holes 86 are formed in the heat dissipation blocks 811, 812 near both ends such that the through holes 86 are parallel to the axial direction of the motor 2. Two screws 87*b* are inserted to the through hole 86 on one diagonal line and screwed to the motor case 10. Two screws 87*a* are inserted from a cover 88 (explained in detail later) and through the through holes 86 on the other diagonal line and are screwed to the motor case 10.

An upper arm unit 50 and a lower arm unit 59 (explained in detail later) are attached to the upper surface 821 and the outside surface 831 of the heat dissipation block 811 respectively with screws 72. An upper arm unit 60 and a lower arm unit 69 (explained in detail later) are attached to the upper surface 822 and the outside surface 832 of the heat dissipation block 812 respectively with screws 72.

Next, the upper and lower arm units 50, 59, 60, 69 will be explained. The upper and lower arm units 50, 59, 60, 69 constitute the bridge circuits of the inverter device 4 for the systems respectively. The upper arm unit 50 and the lower arm unit 59 of the first system correspond to the inverter circuit 500 of FIG. 1 except the shunt resistances 46. The upper arm unit 60 and the lower arm unit 69 of the second system correspond to the inverter circuit 600 of FIG. 1 except the shunt resistances 46. The upper arm unit 50 and the lower arm unit 59 of the first system will be explained below as representative examples. The upper arm unit 60 and the lower arm unit 69 of the second system are the same as the first system.

The upper arm unit 50 is composed of the four power elements 51, 53, 55, 57 and a unit base 71. The power elements 51, 53, 55 are switching elements on the power supply side. The power element 57 is the power element for the power supply relay. The power elements 51, 53, 55, 57 are aligned and mounted on the unit base 71 such that directions of lead sections 79 of the power elements 51, 53, 55, 57 are uniformed.

The lower arm unit 59 is, composed of the four power elements 52, 54, 55, 58 and a unit base 71. The power elements 52, 54, 56 are switching elements on the ground side. The power element 58 is the power element for the power supply relay. The power elements 52, 54, 56, 58 are aligned and mounted on the unit base 71 such that directions of lead sections 79 of the power elements 52, 54, 56, 58 are uniformed.

Each of the power elements 51-58 is the commercial general-purpose MOS. A main body section 77 of each of the power elements 51-58 is formed by inserting a semiconductor chip in a resin by resin molding. As shown in FIG. 15, three lead sections 79 extend from one side surface of the main body section 77 of each of the power elements 51-58. The three lead sections 79 are a gate 79*g*, a source 79*s* and a drain 79*d*. A drain electrode 78 is exposed on one end surface of the main body section 77. The drain 79*d* and the drain electrode 78 are electrically short-circuited with each other.

The unit base 71 is formed by laminating a metal layer 71*m*, which is made of aluminum, with a resin layer 71*p*. The metal layer 71*m* corresponds to the heat dissipation layer according to the present invention. The resin layer 71*p* corresponds to the insulation layer according to the present invention.

When the power elements 51-58 are mounted on the unit base 71, a soldering process is performed such that the drain electrodes 78 contact the insulation layer 71*p*. The drain electrodes 78 and the metal layer 71*m* are insulated from each other by the insulation layer 71*p*.

The upper arm unit 50 is attached such that the metal layer 71*m* of the unit base 71 contacts the upper surface 821 of the heat dissipation block 811. At that time, the lead sections 79 of each of the power elements 51, 53, 55, 57 are bent substantially at the right angle from an outside surface 83 side of the main body section 77 to extend toward the power substrate 41 side (upward in FIGS. 13A and 13B). The lower arm unit 59 is attached such that the metal layer 71*m* of the unit base 71 contacts the outside surface 831 of the heat dissipation block 811. At that time, the lead sections 79 of the power elements 52, 54, 56, 58 extend straight toward the power substrate 41 side (upward in FIGS. 13A and 13B). That is, the upper arm unit 50 and the lower arm unit 59 are arranged such that the lead sections 79 of the power elements 51-58 are directed toward the power substrate 41 and are close to each other.

The upper and lower arm units 60, 69 of the second system are mounted on the upper surface 822 and the outside surface 832 of the other heat dissipation block 812 of the heat sink 80 to be symmetrical to the upper and lower arm units 50, 59 of the first system across the symmetrical axis A of the heat sink 80.

Next, the power substrate assembly 40 will be explained. As shown in FIGS. 16 to 18, in the power substrate assembly 40, the choke coil 44, the electrolytic capacitor 43, the four electrolytic capacitors 45 and a power connector 47 are mounted on a motor 2 side of the power substrate 41. The power substrate assembly 40 and the upper and lower arm units 50, 59, 60, 69 constitute the power section 400 shown in FIG. 1. The power substrate 41 is screwed to the heat sink 80 with screws 39 from a side opposite to the motor 2.

Power wirings, to which drive current for driving the motor 2 is passed, are formed on the power substrate 41. For example, in the first system, a wiring for connecting the switching power element 51, 53, 55'on the power supply line side, a wiring for connecting the switching power elements 52, 54, 56 on the ground side, a wiring for connecting the power supply relay power element 58 with the switching power elements 51, 53, 55, a wiring for connecting the power supply relay power element 57 with the choke coil 44 and the electrolytic capacitor 43 and the like are formed on the power substrate 41.

The lead sections 79 of the power elements 51-58, 61-68 are passed through through holes 41*h* of the power substrate 41. The power substrate 41 is electrically connected with the power elements 51-58, 61-68 by the soldering process or the like. The power substrate 41 is electrically connected with the motor lines 27 by the soldering process or the like outside the through holes 41*h*. The alternating-current power produced by the inverter device 4 is supplied to the windings 26 wound around the stator 20 via the motor lines 27.

The choke coil 44, the electrolytic capacitor 43, the four electrolytic capacitors 45 and the power connector 47 are arranged in a space, which is formed between the connecting section 84 of the heat sink 80 and the power substrate 41 and between the heat dissipation blocks 811, 812. That is, these electronic components are arranged in the space other than the spaces necessary for mounting the upper and lower arm units 50, 59, 60, 69.

The power connector 47 is provided on a side opposite to the control connector 99. If the power connector 47 is connected with the battery 9, the electric power is supplied to the power substrate 41. A substrate connection terminal 42 electrically connects the power substrate 41 and the control board 98. A control signal outputted from the control board assembly 90 is inputted to the gates 79*g* of the power elements 51-58, 61-68 via the substrate connection terminal 42 and the power substrate 41.

The cover 88 is formed from a magnetic material such as iron in the shape of a cylinder having a bottom. The cover 88 prevents an electric field from leaking outward from the inverter device 4 side and prevents dust and the like from entering the inverter device 4 side. The cover 88 is fixed to the heat sink 80 and the motor case 10 by threading screws 87a to the motor case 10 through holes of the cover 88 and the through holes 86 of the heat sink 80. The cover 88 has cut portions 88n at positions corresponding to the control connector 99 and the power connector 47. A protrusion 18 of the resin guide 16 fits into the cut portion 88n on the power connector 47 side.

(Actions)

Next, actions of the inverter device 4 and the drive unit 1 will be explained. The microcomputer 94 of the control board assembly 90 produces pulse signals, which are formed by PWM control, through the pre-drivers 91 based on the signals from the position sensor 93, the torque sensor 8, the shunt resistances 46 and the like such that the drive unit 1 assists the steering of the steering 5 in accordance with the vehicle speed.

The pulse signals are outputted to the switching power elements 51-56, 61-66 via the substrate connection terminal 42 and the power substrate 41 for controlling the switching actions of the power elements between the on-states and the off-states. Thus, the sine-wave currents having the phases deviated from each other are passed to the respective phases of the windings 26 of the motor 2, thereby forming a rotational magnetic field. In response to the rotational magnetic field, the rotor 30 and the shaft 35 rotate integrally. A driving force is outputted from the output terminal 37 to the gear 7 of the column shaft 6 due to the rotation of the shaft 35, thereby assisting the steering of the steering 5 performed by the driver.

The heats generated by the switching power elements 51-56, 61-66 are dissipated to the heat sink 80 through the unit bases 71. Thus, a failure and malfunction due to the temperature increase of the power elements 51-56, 61-66 can be prevented.

(Effects)

With the above-described construction, the inverter device 4 according to the first embodiment exerts following effects (1) to (7).

(1) The upper arm units 50, 60 and the lower arm units 59, 69 are separated and arranged on the heat dissipation blocks 811, 812 of the heat sink 80 respectively. Accordingly, the heats generated by the power elements 51-58, 61-68 do not interfere with each other. The heats are emitted to the heat dissipation blocks 811, 812 as shown by dashed arrow marks H in FIG. 13B. Therefore, heat dissipation performance of the power elements 51-58, 61-68 can be improved, thereby preventing the failure or the malfunction due to the temperature increase.

(2) In the inverter device having the two systems of the three-phase inverter circuits, the power elements are separated into the upper arm unit and the lower arm unit for each system. Therefore, as compared to the case where the power elements are separated into the respective phases, the number of the units can be reduced from six to four.

(3) The pair of the upper arm unit 50 and the lower arm unit 59 and the pair of the upper arm unit 60 and the lower arm unit 69 are arranged such that the lead sections 79 of the power elements face toward the power substrate 41 and are close to each other. Thus, the wiring distances between the power elements 51-58, 61-68 of the upper and lower arms can be shortened, and the wiring distances between the power elements 51-58, 61-68 and the power supply, the ground, the produced voltage and the like can be shortened. Therefore, wiring impedance can be reduced. Thus, loss in the electric power of the inverter device 4 can be reduced.

(4) The upper arm unit 50 and the lower arm unit 59 are arranged on the upper surface 821 and the outside surface 831 of the heat dissipation block 811 respectively. The upper arm unit 60 and the lower arm unit 69 are arranged on the upper surface 822 and the outside surface 832 of the heat dissipation block 812 respectively. In this way, the upper arm unit and the lower arm unit are not arranged on the same plane but are arranged on the different planes. Thus, the spaces occupied by the upper and lower arm units are sterically aggregated, thereby reducing a projective area. Accordingly, the space can be formed between the heat dissipation blocks 811, 812, and the electronic components such as the choke coil 44 and the electrolytic capacitors 43, 45 can be arranged in the space. Thus, the space can be used effectively, and the inverter device 4 can be reduced in size.

(5) The upper surface 821 and the outside surface 831 of the heat dissipation block 811 are adjacent and perpendicular to each other. The upper surface 822 and the outside surface 832 of the heat dissipation block 812 are adjacent and perpendicular to each other. With such the construction, the upper arm units 50, 60 and the lower arm units 59, 69 can be arranged specifically close to each other. Therefore, the wiring distances between the upper and lower arms can be shortened, and the wiring impedance can be reduced. Thus, the loss in the electric power of the inverter device 4 can be reduced. In addition, the size of the inverter device 4 can be reduced. Since each of the heat dissipation blocks 811, 812 is formed substantially in the shape of a cuboid, design and processing of the inverter device 4 are facilitated.

(6) The upper and lower arm units 50, 59, 60, 69 are arranged on the unit bases 71 to form the subassemblies respectively. Thus, the assembly process of the inverter device 4 can be simplified.

(7) The metal layer 71m of the unit base 71 further improves the effect of the heat dissipation from the power elements 51-58, 61-68 to the heat sink 80.

The resin layer 71p of the unit base 71 insulates the contact surfaces of the power elements and the unit base 71. Therefore, even in the case where the general-purpose power elements, whose drain electrodes 78 are exposed on the surfaces on the unit base 71 side, are used, short-circuit among the power elements can be prevented.

(Comparative Example)

Arrangement of power elements in an inverter device of a comparative example is shown in FIG. 25. In the comparative example, sixteen power elements 48 are arranged collectively on a single substrate 49. The power elements 48 are not arranged separately from each other. Therefore, heats generated by the power elements 48 interfere with each other as shown by dashed arrow marks H, thereby hindering heat dissipation. Therefore, there is a possibility that a failure or malfunction is caused by temperature increase of the power elements 48. The sixteen power elements 48 are arranged on the same plane. Therefore, the area of the substrate 49 enlarges, thereby enlarging the entire physique of the inverter device.

(Second Embodiment)

Figure 19:
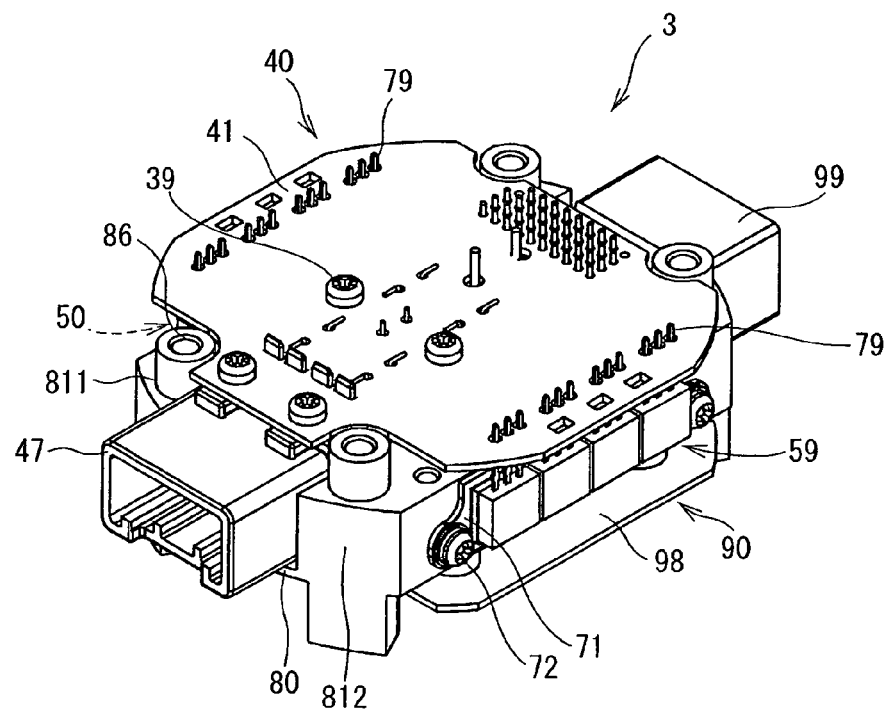
FIG. 19 is a perspective view showing the inverter device according to the second embodiment.
Figure 20A:
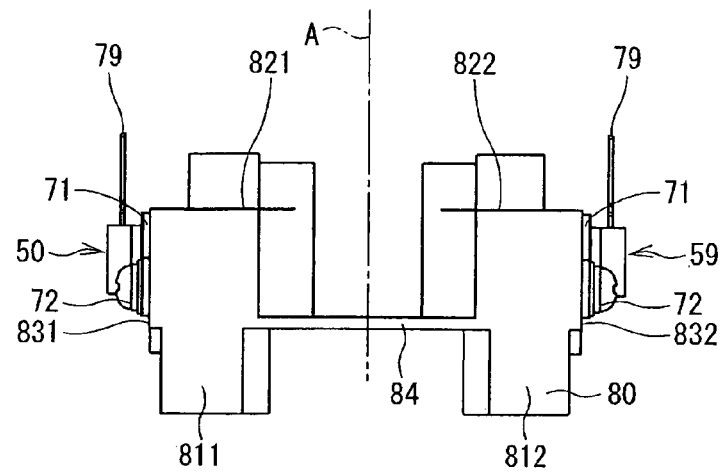
FIG. 20A is a side view showing the inverter device with upper and lower arm units mounted on a heat sink according to the second embodiment.
Figure 20B:
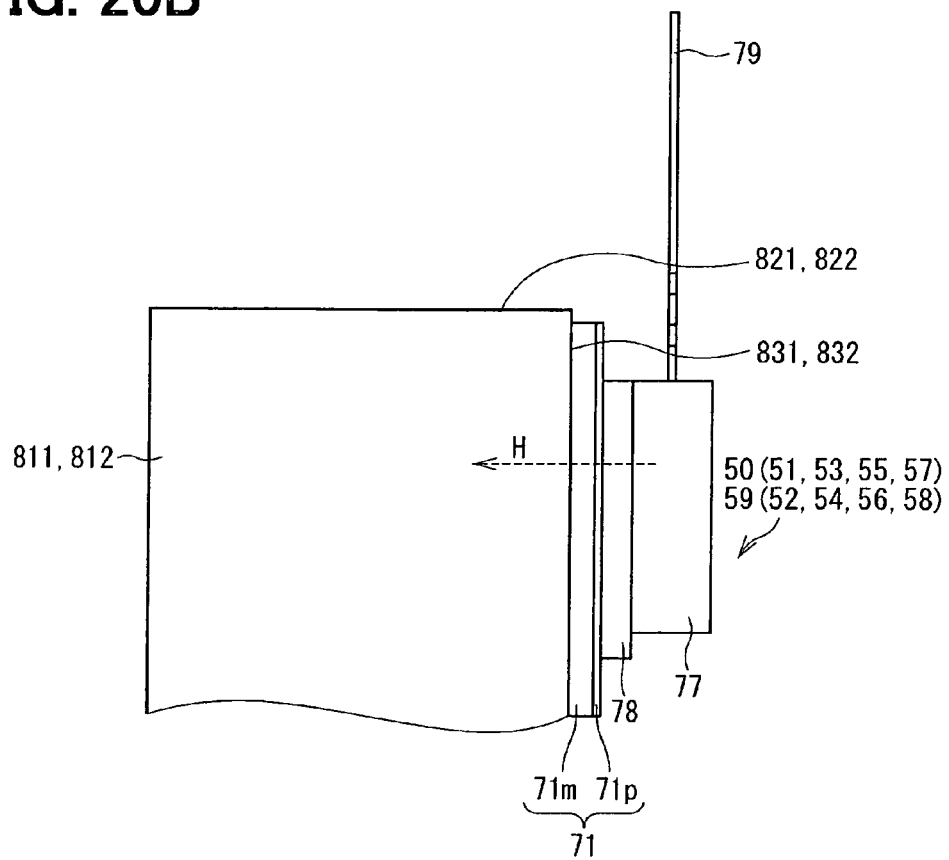
FIG. 20B is a schematic view showing a substantial part of the inverter device with the upper and lower arm units mounted on the heat sink according to the second embodiment.
Figure 21:
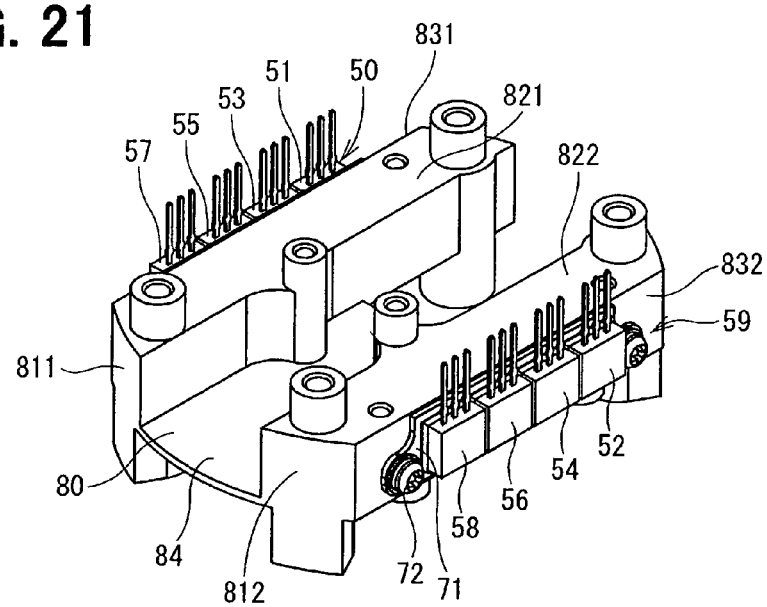
FIG. 21 is a perspective view showing the inverter device with the upper and lower arm units mounted on the heat sink according to the second embodiment.

Next, an inverter device according to a second embodiment of the present invention will be explained with reference to FIGS. 19 to 21. The inverter device 3 according to the second embodiment is applied to a single system of drive unit. The upper arm unit 50 consisting of the power elements 51-54 is attached to the outside surface 831 of one heat dissipation block 811 of the heat sink 80. The lower arm unit 59 consisting of the power elements 55-58 is attached to the outside surface 832 of the other heat dissipation block 812 of the heat sink 80. In this way, the upper arm unit 50 and the lower arm unit 59 are arranged on different planes. The second embodiment exerts the effects (1) to (4), (6) and (7) of the first embodiment.

(Third Embodiment)

Figure 23:
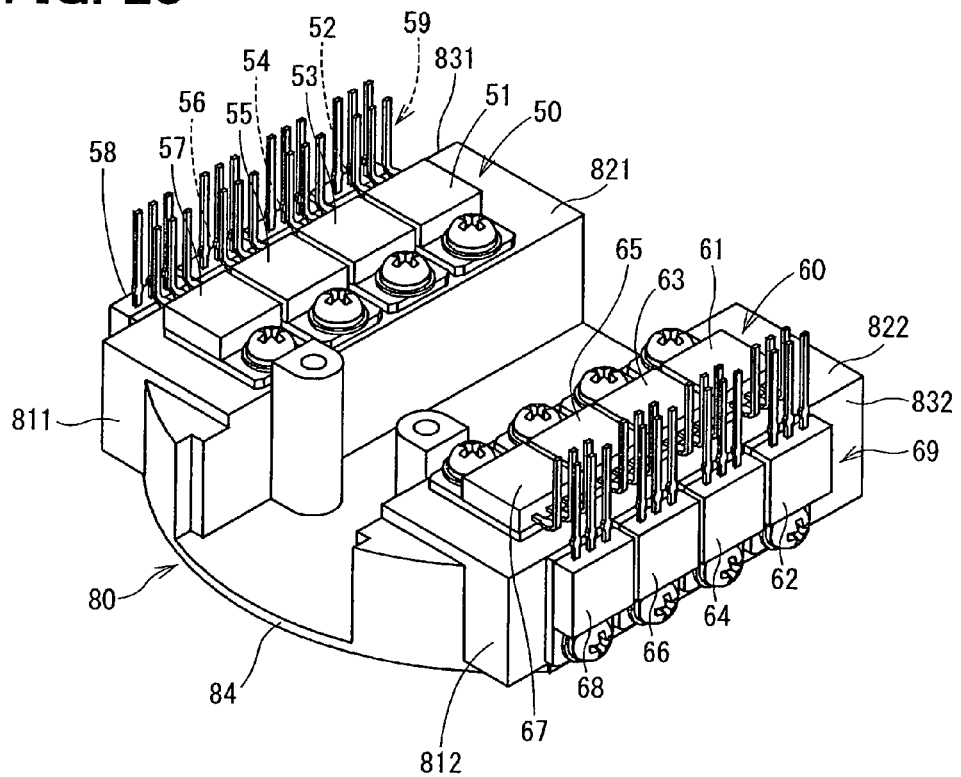
FIG. 23 is a perspective view showing the inverter device with the upper and lower arm units mounted on the heat sink according to the third embodiment.
Figure 22A:
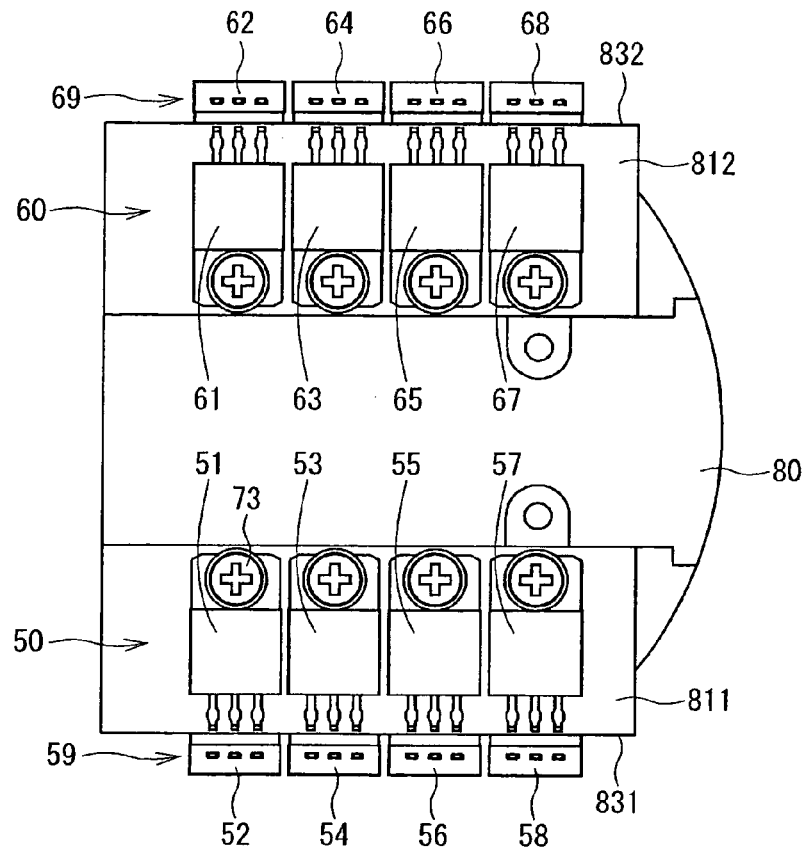
FIG. 22A is a plan view showing an inverter device with upper and lower arm units mounted on a heat sink according to a third embodiment of the present invention.
Figure 22B:
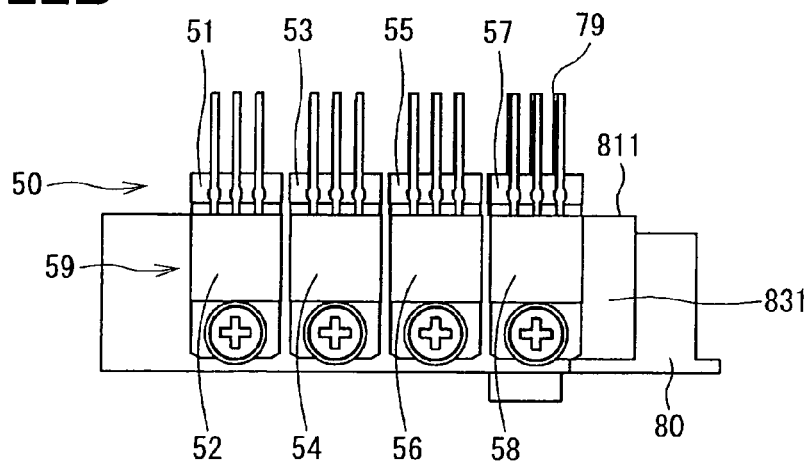
FIG. 22B is a side view showing the inverter device with the upper and lower arm units mounted on the heat sink according to the third embodiment.
Figure 24:
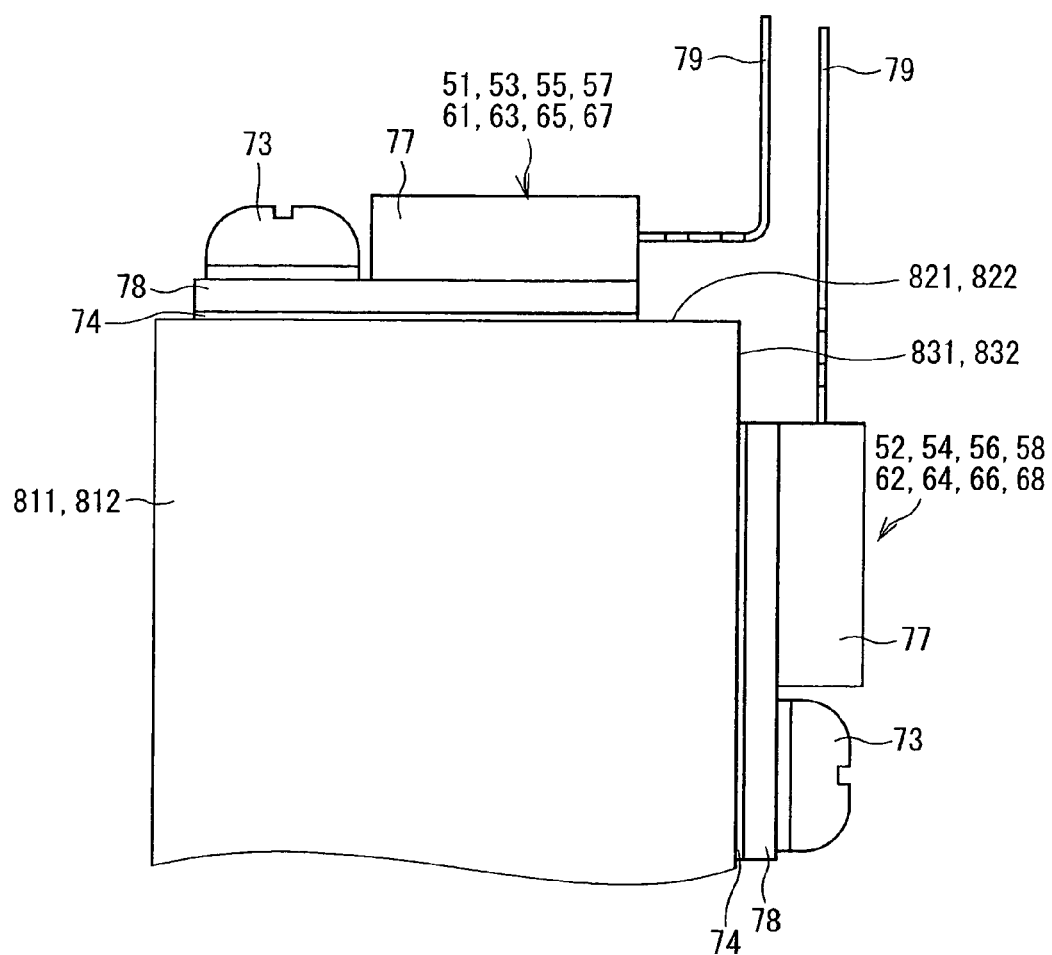
FIG. 24 is a schematic view showing a substantial part of the inverter device according to the third embodiment.

Next, an inverter device according to a third embodiment of the present invention will be explained with reference to FIGS. 22 to 24. The inverter device according to the third embodiment is applied to two systems of drive units. Differently from the first embodiment, the power elements 51-58, 61-68 are not mounted on the unit bases. The power elements 51-58, 61-68 are attached to the heat sink 80 individually by screws 73 or an adhesive.

In this case, if the power elements, whose drain electrodes are exposed, are attached directly to the heat sink 80, the power elements short-circuit with each other. Therefore, it is necessary to interpose an insulation sheet 74 between the drain electrode 78 and the heat sink 80. The insulation sheet 74 is a thin plate made of an insulative material such as silicon. Alternatively, power elements having drain electrodes coated and insulated by a resin may be used. The third embodiment exerts the effects (1) to (5) of the first embodiment.

(Other Embodiments)

(a) In the above description of the embodiments, the drive unit applied to the electric power steering system of the vehicle is explained. Alternatively, the drive unit according to the present invention may be applied to other uses.

(b) In the above description of the embodiments, the two systems of the three-phase alternating-current inverter devices or the single system of the three-phase alternating-current inverter device is explained. The inverter device may correspond to three or more systems. Alternatively, the inverter device may produce alternating-current power of multiple phases other than the three phases.

(c) In the above-described embodiments, the inverter device is arranged on a side of the motor 2 opposite to the gearbox. As another embodiment of the present invention, the inverter device may be arranged between the motor and the gearbox. In this case, the output end of the shaft is arranged on a side of the inverter device opposite to the motor. That is, the shaft extends from the motor and passes through the space between the heat dissipation blocks of the heat sink facing each other. Then, the shaft penetrates through the control board and the power substrate.

(d) In the above-described first or second embodiment, the unit base 71 includes the metal layer 71m as the heat dissipation layer. When the sufficient heat dissipation effect can be obtained only with the heat sink, the heat dissipation layer of the unit base may be eliminated, and the unit base may be constituted by an insulative resin plate or the like.

(e) In the above-described embodiments, the commercial general-purpose MOS is used as the power element. Alternatively, a dedicated power module formed by integrating four MOS by resin molding may be used, for example. Thus, characteristics of the power elements and the size of the power module can be customized in accordance with design specifications of the drive unit, and the number of parts can be reduced.

(f) In the above-described embodiments, the upper and lower arm units include the power elements for the power supply relay in addition to the power elements for the switching. Alternatively, the power elements for the power supply relay may be arranged separately from the switching elements, for example, on the power substrate.

(g) In the above-described embodiments, the heat dissipation blocks 811, 812 of the heat sink 80 are connected by the connecting section 84. Alternatively, the heat dissipation blocks may be formed separately from each other.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An inverter device that produces alternating-current power of a plurality of phases from direct-current power, the inverter device comprising:
   a plurality of power elements constituting a bridge circuit;
   a heat sink that is mounted with the power elements and that is capable of receiving heat generated by the power elements;
   a control wiring section that outputs control signals to the power elements; and
   a power wiring section that inputs and outputs current passed to the power elements, the power wiring section being constituted by a power substrate that is shaped of a flat plate, wherein
   each of the power elements has a main body section, in which a semiconductor chip is inserted in a resin by resin molding, and a lead section that extends from one side of the main body section and that is electrically connected with the power wiring section, and
   an upper arm unit, which is formed by aggregating the power elements on a power supply side of the bridge circuit, and a lower arm unit, which is formed by aggregating the power elements on a ground side of the bridge circuit, are arranged separately from each other, wherein
   the upper arm unit and the lower arm unit are arranged such that the lead sections face to the power wiring section constituted by the power substrate.

2. The inverter device as in claim 1, wherein
   one of the upper arm unit and the lower arm unit is mounted on a first surface of the heat sink, the first surface parallel to the power substrate, and
   the other one of the upper arm unit and the lower arm unit is mounted on a second surface of the heat sink, the second surface being different from the first surface, the second surface perpendicular to the power substrate.

3. The inverter device as in claim 1, wherein
   each of the upper arm unit and the lower arm unit is formed by mounting the power elements on a unit base in the shape of a flat plate.

4. The inverter device as in claim 3, wherein
   the unit base has a heat dissipation layer that is made of a thermally-conductive material and that contacts the heat sink.

5. The inverter device as in claim 3, wherein
   the unit base has an insulation layer for insulating the power elements from each other.

6. The inverter device as in claim 1, wherein
   each of the upper arm unit and the lower arm unit is formed as a power module, in which the power elements are integrated by resin molding.

7. A drive unit comprising:
   a stator, around which windings are wound to form a plurality of phases;
   a rotor arranged radially inside the stator to be rotatable relative to the stator; and
   the inverter device as in claim 1 provided on one axial side of the rotor.

8. The drive unit as in claim 7, wherein
   one of the upper arm unit and the lower arm unit of the inverter device is mounted on a first surface of the heat sink of the inverter device, the first surface parallel to the power substrate, and the other one of the upper arm unit and the lower arm unit is mounted on a second surface of the heat sink, the second surface being different from the first surface, the second surface perpendicular to the power substrate.

9. An inverter device that produces alternating-current power of a plurality of phases from direct-current power, the inverter device comprising:
a plurality of power elements constituting a bridge circuit;
a heat sink that is mounted with the power elements and that is capable of receiving heat generated by the power elements;
a control wiring section that outputs control signals to the power elements; and
a power wiring section that inputs and outputs current passed to the power elements, the power wiring section being constituted by a power substrate that is shaped of a flat plate, wherein
each of the power elements has a main body section, in which a semiconductor chip is inserted in a resin by resin molding, and a lead section that extends from one side of the main body section and that is electrically connected with the power wiring section, and
an upper arm unit, which is formed by aggregating the power elements on a power supply side of the bridge circuit, and a lower arm unit, which is formed by aggregating the power elements on a ground side of the bridge circuit, are arranged separately from each other, wherein
the upper arm unit and the lower arm unit are mounted on different surfaces of the heat sink.

10. The inverter device as in claim 9, wherein
the upper arm unit and the lower arm unit are mounted on the surfaces of the heat sink adjacent to each other.

11. The inverter device as in claim 9, wherein
the upper arm unit and the lower arm unit are mounted on the surfaces of the heat sink perpendicular to each other.

12. The inverter device as in claim 11, wherein
one of the upper arm unit and the lower arm unit is mounted on the surface parallel to the power substrate, and
the other one of the upper arm unit and the lower arm unit is mounted on the surface perpendicular to the power substrate.

13. A drive unit comprising:
a stator, around which windings are wound to form a plurality of phases;
a rotor arranged radially inside the stator to be rotatable relative to the stator; and
the inverter device as in claim 9 provided on one axial side of the rotor.

14. The drive unit as in claim 13, wherein
the upper arm unit and the lower arm unit are mounted on the surfaces of the heat sink adjacent to each other.

15. The drive unit as in claim 13, wherein
the upper arm unit and the lower arm unit are mounted on the surfaces of the heat sink perpendicular to each other.

16. The drive unit as in claim 15, wherein
one of the upper arm unit and the lower arm unit is mounted on the surface parallel to the power substrate, and
the other one of the upper arm unit and the lower arm unit is mounted on the surface perpendicular to the power substrate.

17. The drive unit as in claim 7, wherein
each of the upper arm unit and the lower arm unit is formed by mounting the power elements on a unit base in the shape of a flat plate.

18. The drive unit as in claim 17, wherein
the unit base has a heat dissipation layer that is made of a thermally-conductive material and that contacts the heat sink.

19. The drive unit as in claim 17, wherein
the unit base has an insulation layer for insulating the power elements from each other.

20. The drive unit as in claim 7, wherein
each of the upper arm unit and the lower arm unit is formed as a power module, in which the power elements are integrated by resin molding.

* * * * *